(12) United States Patent (10) Patent No.: US 8,536,070 B2
Gordon et al. (45) Date of Patent: Sep. 17, 2013

(54) VAPOR DEPOSITION OF SILICON DIOXIDE NANOLAMINATES

(75) Inventors: Roy Gerald Gordon, Cambridge, MA (US); Jill S. Becker, Cambridge, MA (US); Dennis Hausmann, Los Gatos, CA (US)

(73) Assignee: President and Fellows of Harvard College, Cambridge, MA (US)

( * ) Notice: Subject to any disclaimer, the term of this patent is extended or adjusted under 35 U.S.C. 154(b) by 24 days.

(21) Appl. No.: 13/189,283

(22) Filed: Jul. 22, 2011

(65) Prior Publication Data

US 2011/0281417 A1 Nov. 17, 2011

Related U.S. Application Data

(63) Continuation of application No. 10/951,464, filed on Sep. 27, 2004, now Pat. No. 8,008,743, which is a continuation-in-part of application No. PCT/US03/09736, filed on Mar. 28, 2003.

(60) Provisional application No. 60/368,292, filed on Mar. 28, 2002, provisional application No. 60/415,617, filed on Oct. 2, 2002.

(51) Int. Cl.
*H01L 21/31* (2006.01)

(52) U.S. Cl.
USPC ..................................... 438/787; 257/E21.24

(58) Field of Classification Search
None
See application file for complete search history.

(56) References Cited

U.S. PATENT DOCUMENTS

| 4,386,117 A | 5/1983 | Gordon |
| 4,474,642 A | 10/1984 | Nakane et al. |
| 4,512,862 A | 4/1985 | Rigby |
| 4,723,978 A | 2/1988 | Clodgo et al. |

(Continued)

FOREIGN PATENT DOCUMENTS

| DE | 43 16 883 A | 11/1994 |
| EP | 0 560 617 A | 9/1993 |

(Continued)

OTHER PUBLICATIONS

Aarik et al., "Influence of Substrate Temperature on Atomic Layer Growth and Properties of $HfO_2$ Thin Films," Thin Solid Films, 340, 1999, pp. 110-116.

(Continued)

*Primary Examiner* — Michael Lebentritt
*Assistant Examiner* — Kevin Quinto
(74) *Attorney, Agent, or Firm* — Wilmer Cutler Pickering Hale and Dorr LLP

(57) ABSTRACT

This invention relates to materials and processes for thin film deposition on solid substrates. Silica/alumina nanolaminates were deposited on heated substrates by the reaction of an aluminum-containing compound with a silanol. The nanolaminates have very uniform thickness and excellent step coverage in holes with aspect ratios over 40:1. The films are transparent and good electrical insulators. This invention also relates to materials and processes for producing improved porous dielectric materials used in the insulation of electrical conductors in microelectronic devices, particularly through materials and processes for producing semi-porous dielectric materials wherein surface porosity is significantly reduced or removed while internal porosity is preserved to maintain a desired low-k value for the overall dielectric material. The invention can also be used to selectively fill narrow trenches with low-k dielectric material while at the same time avoiding deposition of any dielectric on the surface area outside of the trenches.

24 Claims, 9 Drawing Sheets

(56) References Cited

U.S. PATENT DOCUMENTS

| | | | |
|---|---|---|---|
| 4,792,463 | A | 12/1988 | Okada et al. |
| 4,956,323 | A | 9/1990 | Hefner |
| 5,064,686 | A | 11/1991 | McGeary |
| 5,389,401 | A | 2/1995 | Gordon |
| 5,403,630 | A | 4/1995 | Matsui et al. |
| 5,710,075 | A | 1/1998 | Tseng |
| 5,922,787 | A | 7/1999 | Kondo et al. |
| 6,090,442 | A | 7/2000 | Klaus et al. |
| 6,159,855 | A | 12/2000 | Vaartstra |
| 6,203,613 | B1 | 3/2001 | Gates et al. |
| 6,258,707 | B1 | 7/2001 | Uzoh |
| 6,335,288 | B1 | 1/2002 | Kwan et al. |
| 6,339,004 | B1 | 1/2002 | Kim |
| 6,342,432 | B1 | 1/2002 | Wang |
| 6,359,160 | B1 | 3/2002 | Sun et al. |
| 6,395,209 | B2 | 5/2002 | Yoshida et al. |
| 6,482,733 | B2 | 11/2002 | Raaijmakers et al. |
| 6,534,395 | B2 | 3/2003 | Werkhoven et al. |
| 6,867,152 | B1 | 3/2005 | Hausmann et al. |
| 6,949,269 | B2 | 9/2005 | Seidl et al. |
| 6,969,539 | B2 | 11/2005 | Gordon et al. |
| 7,064,227 | B1 | 6/2006 | Lei et al. |
| 7,097,878 | B1 | 8/2006 | Rulkens et al. |
| 7,109,129 | B1 | 9/2006 | Papasouliotis |
| 7,115,528 | B2 | 10/2006 | Vaartstra et al. |
| 7,129,189 | B1 | 10/2006 | Hausmann et al. |
| 7,135,418 | B1 | 11/2006 | Papasouliotis |
| 7,148,155 | B1 | 12/2006 | Tarafdar et al. |
| 7,157,385 | B2 | 1/2007 | Derderian et al. |
| 7,163,899 | B1 | 1/2007 | Cho et al. |
| 7,390,756 | B2 | 6/2008 | Ahn et al. |
| 7,507,848 | B2 | 3/2009 | Gordon et al. |
| 2001/0041250 | A1* | 11/2001 | Werkhoven et al. ......... 428/212 |
| 2001/0054769 | A1 | 12/2001 | Raaijmakers et al. |
| 2002/0004281 | A1 | 1/2002 | Lee et al. |
| 2002/0018849 | A1 | 2/2002 | George et al. |
| 2002/0102814 | A1 | 8/2002 | Olsen |
| 2003/0015764 | A1* | 1/2003 | Raaijmakers et al. ........ 257/424 |
| 2003/0129087 | A1 | 7/2003 | Barbee et al. |
| 2004/0018694 | A1 | 1/2004 | Lee et al. |
| 2005/0065358 | A1 | 3/2005 | Itsuki et al. |
| 2006/0046426 | A1 | 3/2006 | Sandhu et al. |
| 2006/0046518 | A1 | 3/2006 | Hill et al. |
| 2006/0062910 | A1 | 3/2006 | Meiere |
| 2006/0110936 | A1 | 5/2006 | Hill et al. |
| 2006/0246719 | A1 | 11/2006 | Rueger et al. |
| 2006/0258078 | A1 | 11/2006 | Lee et al. |
| 2007/0160761 | A1 | 7/2007 | Reuter et al. |

FOREIGN PATENT DOCUMENTS

| | | |
|---|---|---|
| EP | 1067595 A2 | 1/2001 |
| JP | 3177560 A | 8/1991 |
| JP | 04359515 | 12/1992 |
| JP | 06140390 A | 5/1994 |
| JP | 07153696 A | 6/1995 |
| JP | 2001-074931 A | 3/2001 |
| JP | 2002-093803 A2 | 3/2002 |
| JP | 2002-093804 A2 | 3/2002 |
| JP | 3409290 | 5/2003 |
| KP | 10-2005-0039421 | 4/2005 |
| KR | 156980 A2 | 7/1998 |
| WO | WO-91/08322 A1 | 6/1991 |
| WO | WO-97/38355 | 10/1997 |
| WO | WO-98/15669 A | 4/1998 |
| WO | WO-99/29924 A | 6/1999 |
| WO | WO-99/29926 A | 6/1999 |
| WO | WO-00/16377 A2 | 3/2000 |
| WO | WO-01/27347 | 4/2001 |
| WO | WO-01/45158 A1 | 6/2001 |
| WO | WO-02/27063 A2 | 4/2002 |
| WO | WO-03/083167 | 10/2003 |

OTHER PUBLICATIONS

Backer et al., "Esters Mixtes De L'Acide Tetrathio Orthosilicique", *Rev. Tray. Chim.*, vol. 61, pp. 500-512, 1942.

Becker et al., "Diffusion barrier properties of tungstein nitride films grown by atomic layer deposition from bis(tertObutylimido)bis(dimethylamido) tungsten and ammonia", *Applied Physics Letters*, vol. 82, No. 14, pp. 2239-2241, 2003.

Bradley et al., "Metallo-organic Compounds Containing Metal-Nitrogen Bonds. Part VI Infrared and Nuclear Magnetic Resonance of Dialkylamido-derivatives of Titanium, Vanadium, Zirconium Niobium, Hafnium, Tantalum, and Thorium", *J. Chem. Soc.. A*., pp. 980-984, 1969.

Bradley, et al., "Metallo-organic Compounds containing Metal-Nitrogen bonds. Part I. Some Dialkylamino-derivatives of Titanium and Zirconium," J. Amer. Chem. Soc., 1955, 77, pp. 3857-3861.

Chang, J.P. and Lin, Y.S. "Thermal stability of stacked high-k dielectrics on silicon" *Applied Physics Lettes*, vol. 79, No. 23, Dec. 3, 2001, pp. 3824-3826.

Coltrin, M. et al., "Chemical kinetics in chemical vapor deposition: growth of silicon dioxide from tetraethoxysilane (TEOS)", *Thin Solid Films, Elsevier-Sequoia S.A., Lausanne, Ch*, vol. 365, No. 2, pp. 251-263, XP004197205, ISSN: 0040-6090, Apr. 2000.

European Search Report issued for European Patent Application No. EP 06026277, dated Feb. 27, 2007, 2 pages.

Ferguson et al., "Atomic Layer Deposition of A12O3 and SiO2 on BN Particles using Sequential Surface Reactions", *Applied Surface Science*, vols. 162-163, pp. 280-292, 2000.

Ferguson et al., "Atomic Layer Deposition of SiO2 Films on Bn Particles using Sequential Surface Reactions", *Chem. Mater*, vol. 12, pp. 3472-3480, 2000.

Fix, R. et al., "Chemical Vapor Deposition of Titanium, Zirconium, and Hafnium Nitride Thin Films," Chemistry of Materials 3(1991) Nov./Dec., No. 6, Washington, DC, US, pp. 1138-1148.

Furumura, Y. Abstract for "High-K dielectrics for DRAM applications," Advanced Metalization and Interconnect Systems for USLI Applications in 1996, 1 Page, 1998.

Gasser et al., "Quasi-Monolayer Deposition of Silicon Dioxide", *Thin Solid Films*, vol. 250, pp. 213-218, 1994.

George et al., "Atomic Layer Controlled Deposition of SiO2 and Al2O3 Using ABAB . . . binary reaction sequence chemistry", *Appl. Surf. Sci.*, 82/83, pp. 460-467, 1994.

Gordon et al., "Vapor Deposition of Metal Oxides and Silicates: Possible Gate Insulators for Future Microelectronics," Chem. Mater., 2001, 13, pp. 2463-2464.

Haukka, et al., "Chemisorption of chromium acetylacetonate on porous high surface area silica," Applied Surface Science 75, 1994, 220-227, 8 pages.

Hausmann et al., "Rapid Vapor Deposition of Highly Conformal Silica Nanolaminates", *Science*, vol. 298, pp. 402-406, 2002.

Hausmann et al. "Atomic Layer Deposition of Hafnium and Zirconium Oxides Using Metal Amide Precursors" *Chem. Mater.* 2002, 14, 4350-4358.

Hughes et al. "Why are some properties more difficult to predict than others? A study of QSPR models of solubility, melting point, and Log P" *J. Chem. Inf. Model*, 2008, 48, 220-232.

Ikeda, Y. et al., Ozone/Organic-Source APCVD for ULSI Reflow Glass Films: *NEC Research and Development, Nippon Electric, Ltd.*, No. 94, pp. 1-7, XP000067542, ISSN: 0547-051X, Jul. 1, 1989.

International Search Report and Written Opinion of the International Searching Authority, the European Patent Office, for International Application No. PCT/US03/09736, mailing date Sep. 12, 2003, 7 pages.

International Search Report of the International Searching Authority, the European Patent Office, for PCT/US01/30507, mailing date Aug. 19, 2002, 5 pages.

Jeon et al. "Thermal stability of ultrathin $ZrO_2$ films prepared by chemical vapor deposition on Si(100)" *Applied Physics Letters*, vol. 78, No. 3, Jan. 15, 2001, pp. 368-370.

Jones, et al., "MOCVD and ALD of High-$_K$ Dielectric Oxides Using Alkoxide Precursors," Chemical Vapor Deposition, 2006, 12, pp. 83-98.

Kang et al. Abstract for "Electrical characteristics of highly reliable ultrathin hafnium oxide gate dielectric," Materials Research Society Symposium Proceedings, 2000, 1 Page.

Kang et al. Abstract for "Highly reliable thin hafnium oxide gate dielectric," IEEE Electron Device Letters, 2000, 1 Page.

Kingon et al., "Alternative dielectrics to silicon dioxide for memory and logic devices", *Nature*, vol. 406, pp. 1032-1038, 2000.

Klaus et al., "Atomic Layer Deposition of SiO2 at Room Temperature using NH3-catalyzed Sequential Surface Reactions", *Surf. Sci.*, vol. 447, pp. 81-90, 2000.

Klaus et al., "Atomic Layer Deposition of SiO2 using Catalyzed and Uncatalyzed Self-Limiting Surface Reactions", *Surface Review and Letters*, vol. 6, No. 3, pp. 435-448, 1999.

Kukli et al., "Low-Temperature Deposition of Zirconium Oxide-Based Nanocrystalline Films by Alternate Supply of $Zr[OC(CH_3)_3]_4$ and $H_2O^{**}$," Chemical Vapor Deposition, 2000, 6, No. 6, pp. 297-302.

Kukli et al., "Atomic Layer Deposition of Hafnium Dioxide Films from Hafnium Tetrakis (ethylmethylamide) and Water**," Chemical Vapor Deposition, 2002, 8, No. 5, pp. 199-204.

Lee et al. Abstract for "High-quality ultrathin CVD HfO2 gate stack with poly-Si gate electrode," Institute of Electrical and Electronics Engineers, 2008, 1 Page.

Lee et al. Abstract for "Ultrathin hafnium oxide with low leakage and excellent reliability for alternative gate dielectric application," Technical Digest: International Electron Devices Meeting, 1999, 1 Page.

Lee et al., "Mass Production Worthy $HfO_2$-$Al_2O_3$ Laminate Capacitor Technology using Hf Liquid Precursor for Sub-100nm DRAMS", *Presented at IEEE IEDM (International Electronic Devices Meeting)*, San Francisco, CA, pp. 9-11 Dec. 2002.

Leng et al. Abstract for "Rotating compensator spectroscopic ellipsometry (RCSE) and its application to high-k dielectric film HfO2," Proceedings of SPIE, 2008, 1 Page.

McIvor et al., "Preparation and Toxicity of Some Alkyl Thiopyrophosphates", *Canadian J. Chemistry*, vol. 34, pp. 1825-1827, 1956.

Min et al. "Atomic Layer Deposition of TiN Films by Alternate Supply of Tetrakis (ethylmethylamino)-Titanium and Ammonia" *J. Appl. Phys.* vol. 37, 1998, pp. 4999-5004.

Morishita et al., "New Substances for Atomic-Layer Deposition of Silicon Dioxide", *J. Non-Crystalline Solids*, vol. 187, pp. 66-69, 1995.

Nugent, W. et al., "Som Bis(tert-butylimido) Complexes of the Group 6 Transition Metals and a Related Alkylamido Derivative," Inorg. Chem. 1980, 19, pp. 777-779.

Okamoto et al., "Convenient Synthetic Route to Mono-Or Dialkyl Phosphate from Inorganix Phosphorus Acids", *Phosphorus, Sulfur and Silicon*, vol. 55, pp. 195-200, 1991.

Ott, et al., "Modification of Porous Alumina Membranes Using $Al_2O_3$ Atomic Layer Controlled Deposition," Chem. Matter, 1997, 9, pp. 707-714, 8 pages.

Park et al., "Mass-Productive Ultra-Low Temperature ALD $SiO_2$ Process Promising for Sub 90nm Memory and Logic Devices", *Presented at IEEE IEDM (International Electronic Devices Meeting)*, San Francisco, CA, Dec. 9-11, 2002.

Puurunen, "Surface Chemistry of Atomic Layer Deposition: A Case Study for the Trimethyaluminum/water Process," Journal of Applied Physics 97, 121301, 2005, 52 pages.

Qi et al. Abstract for "High-K gate dielectrics," Proceedings of SPIE, 2008, 1 Page.

Ritala et al., "Atomic Layer Deposition of Oxide Thin Films with Metal Alkoxides as Oxygen Sources", *Science*, vol. 288, pp. 319-321, 2000.

Ritala, "Advanced ALE processes of amorphous and polycrystalline films", *Applied Surface Science*, vol. 112, pp. 223-230, 1997.

Ritala et al., "Controlled Growth of TaN, $Ta_3N_5$, and $TaO_xN_y$ Thin Films by Atomic Layer Deposition," Chem. Mater., 1999, vol. 11, No. 7, pp. 1712-1718.

Sun et al. "Interfacial silicon oxide formation during synthesis of $ZrO_2$ on Si(100)" *Applied Surface Science* 161, 2000, pp. 115-122.

Voronkov, et al., "Reaction of TRIS (Trimethylsilyl) Phosphate with Salts of Inorganic and Organic Acids," UDS 542.91:547.1'128'118, 1 page, 1978.

Yamaguchi et al., "Atomic-Layer Chemical-Vapor-Deposition of Silicon Dioxide Films with an Extremely Low Hydrogen Content", *Applied Surface Science*, vols. 130-132, pp. 202-207, 1998.

Zwierzak et al., "Organophosphorus Esters—t-Butyl as Protecting Group lin Phosphorylation via Nucleophilic Displacement", *Tetrahedron*, vol. 27, pp. 3163-3170, 1971.

"Table 36 DRAM Trench Capacitor Films Technology Requirements." 2000 Update, International Technology Roadmap for Semiconductors, 1 Page, retrieved from http://www.itrs.net/Links/2000UpdateFinal/2kUdFinal.html.

Bergstrom et al., "Molecular Descriptors Influencing Melting Point and Their Role in Classification of Solid Drugs," J. Chem. Inf. Comput. Sci., 2003, 43, pp. 1177-1185.

Chiu, "Chemical Vapor Deposition 803," Kirk-Othmer Encyclopedia of Chemical Technology, vol. 5, Jul. 2004, pp. 803-813.

Choy, "Chemical Vapour Deposition of Coatings," Progress in Materials Science, 48, 2003, pp. 57-170.

Condorelli et al., "Engineering of Molecular Architectures of β-diketonate Precursors Toward New Advanced Materials," Science Direct, Coordination Chemistry Reviews, 251, 2007, pp. 1931-1950.

Kukli et al., "Low-Temperature Deposition of Zirconium Oxide-Based Nanocrystalline Films by Alternate Supply of $Zr[OC(CH_3)_3]_4$ and $H_2O^{**}$," Chemical Vapor Deposition, 2000, 6, No. 6, pp. 297-302.

Leskela et al., "Atomic Layer Deposition (ALD): From Precursors to Thin Film Structures," Thin Solid Films 409, 2002, pp. 138-146.

McElwee-White, "Design of Precursors for the CVD of Inorganic Thin Films," Dalton Trans., 2006, pp. 5327-5333.

Min et al., "Metal-Organic Atomic-Layer Deposition of Titanium-Silicon-Nitride Films," Applied Physics Letters, vol. 75, No. 11, Sep. 1999, pp. 1521-1523.

Sundermeyer, "Neu Organometall-Imide des Molybdans and Wolframs—die direkte Einfuhrung der Cyclopentadienyl-Gruppe durch Maskierung der hohen Oxidationsstufe," Che. Ber., 124, 1991, pp. 1977-1979, English Abstract Only.

\* cited by examiner

Fig. 7 (continued)
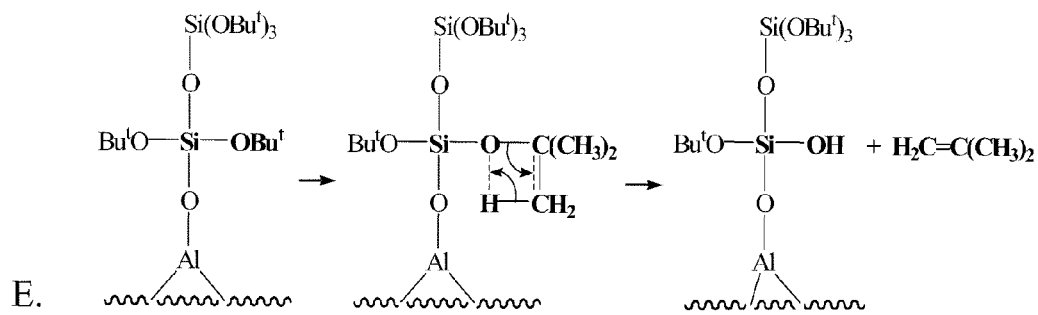
E.
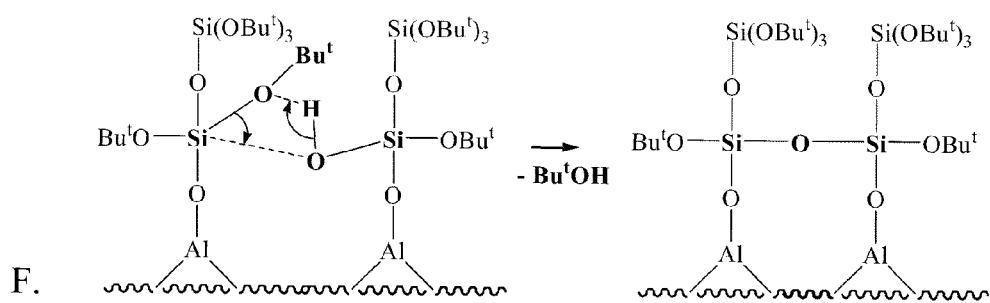
F.
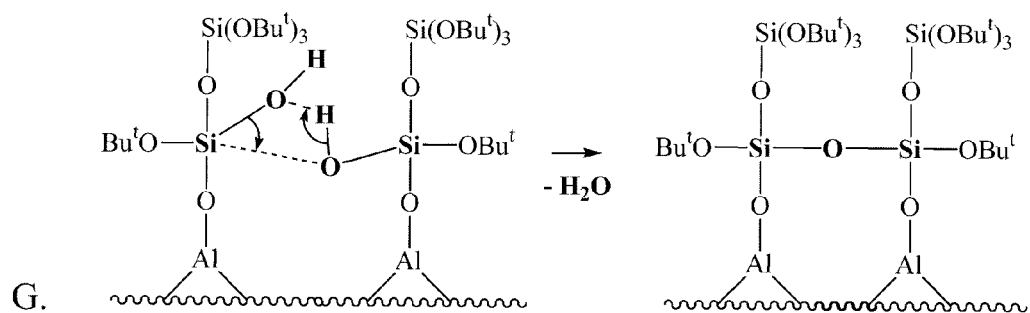
G.

VAPOR DEPOSITION OF SILICON DIOXIDE NANOLAMINATES

RELATED APPLICATIONS

This patent application claims the benefit of the earlier filing date of U.S. patent application Ser. No. 10/951,464, filed Sep. 27, 2004, which claims the benefit of the earlier filing date of PCT Application No. PCT/US03/09736, filed Mar. 28, 2003, which claims benefit of the earlier filing date of U.S. Patent Application Nos. 60/368,292, filed Mar. 28, 2002 and 60/415,617, filed Oct. 2, 2002, the contents of which are incorporated by reference herein in their entireties.

STATEMENT AS TO FEDERALLY SPONSORED RESEARCH

This invention was made with the support of the United States government under National Science Foundation Grant No. ECS-9975504. The United States government has certain rights in the invention.

BACKGROUND OF THE INVENTION

1. Field of the Invention

This invention relates to materials and processes for thin film deposition, and in particular, selective thin film deposition, on solid substrates.

This invention also relates to methods and materials for making conformal films for fabrication of devices in the areas of microelectronics and optics.

This invention also relates to materials and processes for producing improved porous dielectric materials used in the insulation of electrical conductors in microelectronic devices.

2. Description of the Related Art

Atomic layer deposition (also known as atomic layer epitaxy) is a process for depositing thin layers of solid materials from two vapor precursors. The surface of a substrate onto which film is to be deposited is exposed to a dose of vapor from one precursor to deposit a monolayer; then, any excess unreacted vapor from that precursor is pumped away. Next, a vapor dose of the second precursor is brought to the surface and allowed to react with the monolayer of the first precursor. This cycle of steps can be repeated to build up thicker films. One particularly important aspect of this process is that the atomic layer deposition reactions are self-limiting, in that only a certain maximum thickness can form in each cycle, after which no further deposition occurs during that cycle, even if excess reactant is available. Because of this self-limiting character, these deposition reactions produce coatings with highly uniform thicknesses. Uniformity of atomic layer deposition film thicknesses extends not only over flat substrate surfaces, but also into narrow holes and trenches. This ability of atomic layer deposition to make conformal films is called "good step coverage."

One disadvantage of the existing atomic layer deposition process is its slow deposition rate, at typically less than 0.1 nanometer (nm) per cycle. Generally accepted theories regarding atomic layer deposition state that deposition rates cannot be larger than about 0.2 nm per cycle. These slow rates mean very low productivity, which has meant that atomic layer deposition is too expensive for most potential applications. Previously known reactions for the atomic layer deposition of silica are particularly slow, requiring more than one minute to complete a reaction cycle. See S. M. George et al., Appl. Surf. Sci. 82/83, 460 (1994); W. Gasser, Y. Uchida, M. Matsumura, Thin Solid Films 250, 213 (1994); S. Morishita, W. Gasser, K. Usami, M. Matusmura, J. Non-Crystalline Solids 187, 66 (1995); K. Yamaguchi, S. Imai, N. Ishitobi, M. Takemoto, H. Miki, M. Matsumura, Appl. Surf. Sci. 130-132, 202 (1998); J. W. Klaus, O. Sneh, A. W. Ott and S. M. George, Surface Review and Letters 6, 435 (1999); J. D. Ferguson, A. W. Weimer and S. M. George, Applied Surface Science 162-163, 280 (2000); J. D. Ferguson, A. W. Weimer and S. M. George, Chem. Mater. 12, 3472 (2000); J. W. Klaus, S. M. George, Surf. Sci. 447, 81 (2000).

Another disadvantage of existing atomic layer deposition processes is that the deposited film forms indiscriminately on all exposed surfaces. While substrate masking may avoid deposition in certain areas, it is not always convenient or possible to integrate masking into the fabrication process. The ability to selectively deposit a film of uniform thickness would be highly attractive in many device fabrication processes.

Silica has remained the dielectric material of choice in microelectronics for much of the past four decades. However, as the sizes of microelectronic devices have become progressively smaller, and integrated circuits are reduced in size to deeper sub-micron dimensions, signal propagation delay, electrical cross talk between conductors, and power consumption are greatly increased due to parasitic capacitance and resistance. As transistors shrink and the total amount of interconnect wiring increases, delays in that wiring greatly impact circuit performance. As wires become closer together and operating frequencies climb, cross talk between adjacent lines can degrade signal integrity. A better insulator, i.e., one with a lower k value, between the wires or active device regions reduces this noise. Therefore, there has been a strong demand for low-k inter-metal dielectric materials instead of conventional silica. Further decreases in k values (to below a value of about 2.6) are believed necessary to meet the device performance and power dissipation requirements of microelectronic devices of the future.

Reaching such low-k values generally involves reducing the density of chemical bonds, either by reducing the material density or introducing porosity. A variety of methods currently exist for making porous ultra-low k materials with pore diameters typically in the range from about 1 to about 10 nm. Examples of porous low-k materials include hydrogen silsesquioxane, methyl silsesquioxane, aerogels, xerogels, $SiC_xOH_y$, SiLK® (Dow Chemical), CORAL® (Novellus), Black Diamond® (Applied Materials), and CVD-deposited methyl silanes, etc. These materials have a density on the order of 1.2 grams/cc or less.

The porous nature of these low-k porous dielectric materials presents special structural challenges when they are integrated into microelectronic devices. For example, interconnections between the pores open up diffusion pathways through the ultra-low-k material. Metal atoms from both a barrier metal layer and conductive interconnections may diffuse into the porous insulating material layer. Such diffusion of metal atoms into the porous dielectric layer can lead to excessive leakage currents between other conductive interconnections and lead to a breakdown of the insulating characteristics of the insulating layer. Standard deposition techniques such as atomic layer deposition that deposit an electrically conductive diffusion barrier onto a low-k or ultra low-k material may result in deposition of conducting material inside the pores and can even introduce electrical short circuits through the low-k insulator. See, for example, W. Besling, et al. in Atomic Layer Deposition of Barriers for Interconnect, International Interconnect Technology Conference 2002. In addition, another problem that typically results from the use of porous dielectric materials is that openings formed in such materials have relatively rough sidewalls due to the porous nature of the insulating material. This may create problems in filling the opening with an appropriate conductive metal and undesirable voids, gaps or seams may be created in between the sidewall of the dielectric and the conductive metal.

Thus, what are needed are materials and methods for preserving the desired low-k attributes of porous insulating materials while reducing some or all of the aforementioned problems associated with porous structures.

Another place in which low-k dielectric materials are needed in microelectronic devices is in the trenches that isolate one electrically active region from adjacent ones. In current technology, silica is deposited in these trenches by chemical vapor deposition induced by a high-density plasma. See, for example, U.S. Pat. No. 6,335,288, which shows that this deposition method is limited to trenches with aspect ratios (depth/width) less than 6:1. Devices could be made on smaller areas of silicon if there were methods for filling narrower trenches (higher aspect ratios) with a dielectric, and even more advantageously with a dielectric having a dielectric constant lower that that of silica.

Another difficulty with currently used methods for filling isolation trenches is that the dielectric is also deposited on top of the flat surfaces between the trenches. This material on top then must be removed by a process called chemical-mechanical polishing (CMP). CMP is prone to remove more material in the regions just over the trench, so that the final polished surface is non-planar ("dished"). Dishing during CMP can be avoided by the use of an additional photolithographic step, which adds complexity and cost to the process. Alternatively, additional polish stop layers, sacrificial dielectric layers and etching steps can be used to avoid dishing. See U.S. Pat. No. 6,342,432. It would be highly advantageous be able to fill trenches while avoiding the unwanted deposition of dielectric material on the surfaces outside of the trenches.

Another function of the material deposited inside isolation trenches is to prevent the undesired diffusion of boron and oxygen through the dielectric. Since these elements diffuse readily through silica, a layer of silicon nitride is often required within the trench as a diffusion barrier. See U.S. Pat. No. 6,339,004 and US Patent Application 2002/0004281 for a description of the use of additional silicon nitride layers to prevent diffusion. It would be advantageous to have a process in which the low-k dielectric itself is a sufficient barrier to the diffusion of boron, oxygen or other undesired elements.

SUMMARY OF THE INVENTION

One aspect of the present invention includes a rapid process for depositing coatings, and in one or more embodiments, conformal coatings, particularly those made predominantly of silicon dioxide, on solid substrates. These coatings comprise silicon, oxygen and relatively small amounts of a second metal or metalloid, and optionally, may contain carbon and hydrogen, and relatively small amounts of other elements (e.g., dopants). As used herein, the coatings of the present invention are referred to as "silica" or "silica nanolaminates."

Another aspect of the methods and materials of the present invention is that silica layers with extremely uniform thickness and/or with extremely smooth surfaces are obtained. In some embodiments, the reaction may be carried out in a manner to form films on substrates that may include holes or trenches. Coatings may also be placed on powders, wires, or around and within complicated mechanical structures. The deposition of silica films under one or more embodiments of the present invention produces a sharp interface between substrates and the deposited silica. Another feature of the present invention is the preparation of silica coatings that are substantially free of pinholes or other mechanical defects.

In one aspect, the invention provides a process for producing a thin film by a sequential alternating layer deposition process including one or more deposition cycles, wherein at least one cycle includes exposing a substrate to a vapor of a first reactive compound including at least one element of the thin film to be formed; and at least a portion of the first reactant adsorbs on the surface of the substrate. The first reactive compound includes a metal or metalloid having Lewis acid character. The cycle also includes thereafter exposing the heated substrate to a vapor of a silanol-containing reactant supplying at least silicon and oxygen to the thin film to be formed, wherein the first reactive compound adsorbed on the surface of the substrate reacts with the silanol-containing reactant to form a material that coats the surface of the substrate at those locations where the first reactive compounds are adsorbed. In yet other embodiments, the process further includes exposing the substrate to a vapor of a third reactant comprising a phosphate compound. The sequential alternating layer deposition process deposits a silica layer having a thickness of greater than 2 nm during at least one deposition cycle.

As used herein "silanols" refers to the class of compounds having a silicon atom bonded to one or more hydroxyl (OH) groups; silanols comprise alkoxysilanols, alkoxyalkylsilanols and alkoxysilanediols.

According to one or more embodiments of the present invention, the first reactive compound is a metal or metalloid compound having Lewis acid character. The metal or metalloid compound can comprise metal amides, metal alkyls, metal alkoxides or metal halides, and the metal or metalloid can comprise aluminum, boron, magnesium, scandium, lanthanum, yttrium, zirconium or hafnium.

In one or more embodiments, the Lewis acid metal or metalloid compound includes aluminum compounds that react readily with the slightly acidic protons in silanols. These acidic protons are the ones attached directly to oxygen in the silanol. Aluminum compounds that generally react with these acidic protons include most aluminum alkyls and other organoaluminum compounds, aluminum alkylamides, aluminum alkoxides and aluminum halides. The aluminum compound may contain aluminum-nitrogen bonds. Optionally, in one or more embodiments, the process includes further exposing the substrate to a phosphate compound including (alkyl)phosphate compounds to form ternary or doped compounds.

According to one or more embodiments of the present invention, the vapor deposition of highly uniform silica films is achieved over a range of conditions such as concentrations of reactants and position of the substrate inside the reactor. The invention includes the ability to coat substrates at relatively low temperatures and without plasma damage to substrates. The silicon source is stable in air and water and relatively nonhazardous.

In one or more embodiments of the present invention, a silica/alumina nanolaminate material is produced from an alternating layer deposition process including sequential reaction of a vapor of one or more aluminum compound and a vapor of a silanol compound on the surface of a heated substrate over a plurality of cycles. Each cycle produces a coating of a silica/alumina material of uniform thickness that is conformal to the surface of the substrate. In one or more embodiments, each reaction cycle produces a coating of material having a thickness greater than 20 angstroms.

In one or more embodiments of the present invention, conformal coatings of silica over substrate features such as narrow holes, trenches or other structures are provided. This ability is commonly known as "good step coverage." In one or more embodiments, the substrate includes convoluted geometries such as deep holes or narrow trenches; and the process produces a uniform, conformal film along the sidewall and base of the surface feature.

In one or more embodiments of the present invention, the coating is selectively deposited on a portion, feature or region of the substrate. Selective deposition of a coating material is used for the preferential filling of holes or trenches in the substrate surface or for the deposition of low dielectric constant (low k) materials to provide semi-porous dielectric materials having significantly reduced or no surface porosity while internal porosity is preserved to maintain a desired low-k value for the overall dielectric material.

In one or more embodiments, a silica layer is selectively deposited on a substrate in an alternating layer deposition process. A substrate is exposed to a vapor of one or more aluminum compounds to selectively deposit an aluminum-containing layer. Selective deposition may be accomplished by masking, and then selectively etching of the mask along with the aluminum on top of the mask. In one or more embodiments, the method further comprises the step of, prior to the step of depositing the silanol compound, removing the aluminum-containing material that has become deposited on the outer surface of the substrate adjacent to a hole or trench such that the aluminum-containing material remains adsorbed on the inside surfaces of the hole or trench. The substrate then is exposed to a vapor of a silanol compound, which reacts with the aluminum-containing compound to selectively deposit a silica/alumina layer only in those regions where the aluminum-containing compound had been deposited.

In another embodiment, a substrate with areas of aluminum metal (having the usual native aluminum oxide on its surface) is exposed to silanol vapor, thereby depositing silica on the surface of the aluminum but not on neighboring non-catalytic surfaces.

In another aspect of the present invention, an integrated circuit is provided including a semiconductor substrate with a plurality of neighboring active device regions, trenches embedded within the semiconductor substrate between the neighboring device regions; and a silica nanolaminate material that fills the trenches conformally and without voids, the silica nanolaminate comprising alternating layers of silica having a thickness in the range of about 2-15 nm and alumina having a thickness of about 0.1 nm or more.

In another aspect of the present invention, a method is provided for sealing pores which are present on an outer surface of a substrate having at least one pore defined by a surface opening on the substrate, a sidewall and an interior space. The method includes the steps of depositing a first catalytic material on the outer surface of the substrate, exposing the substrate and catalytic material to a vapor of a second reactive compound, wherein the first catalytic material and second reactive compound react to form a thin film that covers surface openings of the pores, leaving at least a portion of the pore interior as a void space.

Typically, the pores have a diameter of less than about 5-10 nm; however, pores up to about 30 nm in diameter can be sealed in a single deposition cycle according to one or more embodiments of the present invention.

In one or more embodiments, the method further comprises the step of, prior to the step of depositing the second reactive material, removing the catalytic material that has become deposited on the outer surface of the substrate such that the catalytic material remains on at least a portion of at least one sidewall of the pore opening. In one or more embodiments, the deposited catalytic material is selectively removed by reactive ion etching.

In one or more embodiments, the first catalytic material is an aluminum compound, including but not limited to, alkylamides, alkyls, alkoxides or halides, the second reactive compound is a silanol, and the deposited film comprises silica. In one or more embodiments, the film has a dielectric constant equal to or lower than that of pure silica.

In one or more embodiments, the first catalytic material is deposited under deposition conditions or using deposition techniques having poor step coverage so that the region of the pore proximal to the outer surface is preferentially coated with the first catalytic material. The first catalytic material is deposited using a deposition method, including but not limited to, sputtering, evaporation and chemical vapor deposition.

In another aspect of the present invention, an integrated circuit device is provided, which includes a first porous dielectric layer having an outer surface comprising at least one opening defined by at least one sidewall and an interior space. The device also includes a second dielectric in sealing contact with the opening of the first dielectric layer, so as to leave at least a portion of the interior space of the first dielectric material as a void. Finally, the device comprises an electrically conductive interconnection deposited on the second dielectric layer and exposed outer surfaces of the first dielectric layer.

Another aspect of the invention includes an integrated circuit having a semiconductor substrate with a plurality of neighboring active device regions, trenches embedded within the semiconductor substrate between the neighboring device regions, and an silica nanolaminate material that fills the openings conformally and without a void region, the silica nanolaminate comprising alternating layers of silica having a thickness in the range of about 2-20 nm and alumina having a thickness of about 0.1 nm or more.

The practice of the invention facilitates the production of many devices, such as filling trench insulation between transistors in microelectronics, insulating the collars of deep trench capacitors in semiconductor memories, forming insulation between the metal wires in microelectronic devices, sealing low-k semi-porous insulators for electronic devices, making planar waveguides, multiplexers/demultiplexers, micro-electromechanical structures (MEMS), multilayer optical filters, and protective layers against diffusion, oxidation, or corrosion.

BRIEF DESCRIPTION OF THE DRAWINGS

The foregoing and various other aspects, features, and advantages of the present invention, as well as the invention itself, may be more fully appreciated with reference to the following detailed description of the invention when considered in connection with the following drawings. The drawings are presented for the purpose of illustration only and are not intended to be limiting of the invention, in which.

DETAILED DESCRIPTION OF THE INVENTION

Figure 1:
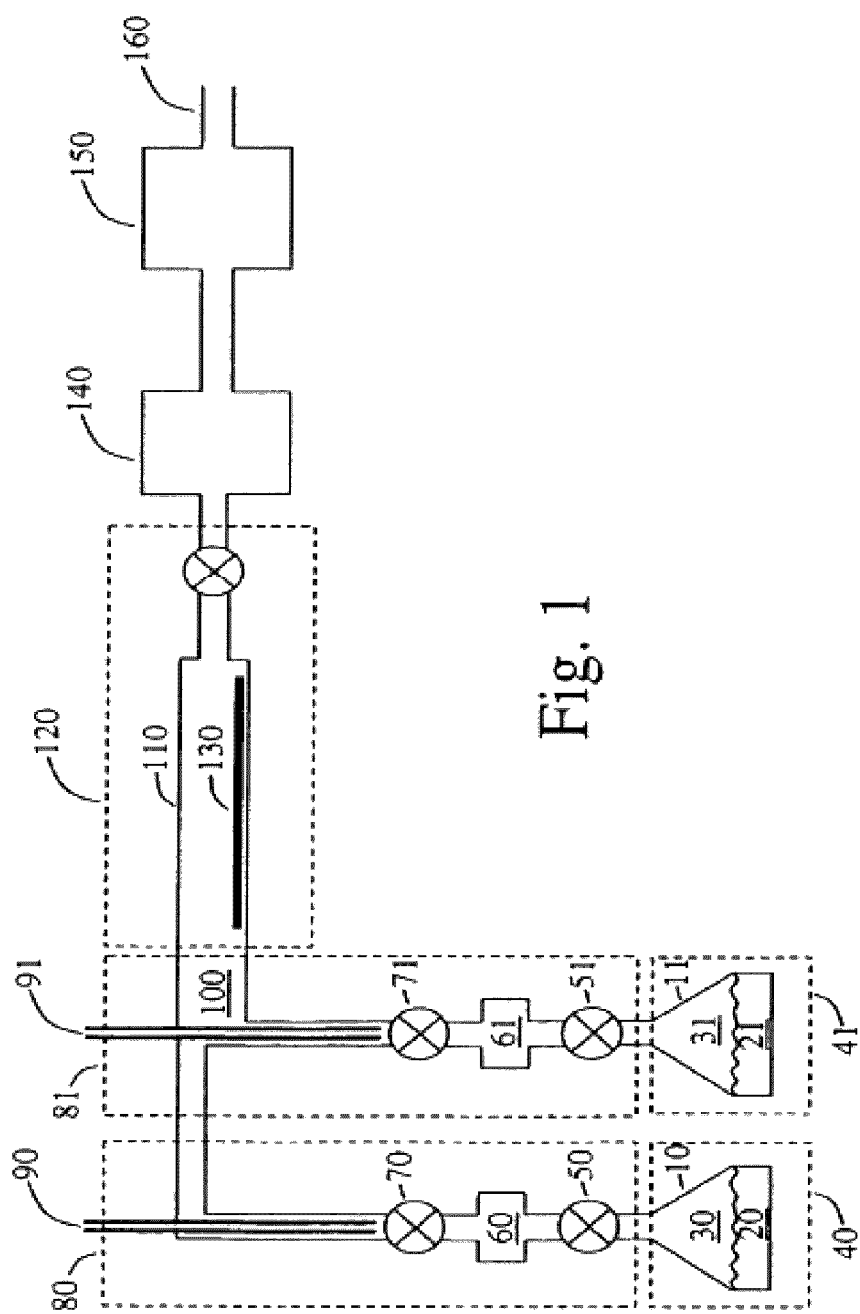
FIG. 1 is a cross-sectional illustration of an alternating layer deposition apparatus used in the practice of at least one embodiment of the invention.

1. Silica Nanolaminates.

The present invention provides a method for preparing silica nanolaminate material comprising silicon, oxygen and a second metal or metalloid. The method involves the reaction of a vapor of one or more metal or metalloid compounds with a vapor of a silanol on the surface of a heated substrate. If the mixed vapors are brought together to the heated surface, a chemical vapor deposition process forms a homogeneous layer comprising silicon, oxygen and a second metal or metalloid.

A silica nanolaminate material may be formed using an adaptation of the atomic layer deposition process, hereinafter called the alternating layer deposition process. The process of the present invention is referred to as "alternating layer deposition," since layers much thicker than a single "atomic" layer are formed in each cycle. In an alternating layer deposition process, a vapor reacts with a surface until a monolayer or less has been chemisorbed. The reaction then stops, so that the process is "self-limiting." A second vapor then reacts with this surface in a second self-limiting reaction depositing a second layer of material, which may be many atoms thick, on the first. As is discussed in further detail herein below, the second layer can be several nanometers (nm) thick. Layers greater than 2 nm, or greater than 5 nm, or greater than 10 nm, or greater than 12 nm, or greater than 15 nm can be deposited in a single deposition cycle. The second reaction also returns the surface to a state in which it is ready to react with the first reactant. The cycle of reactions can then be repeated to build up a binary compound layer by layer. As the process alternates between deposition of the first and second reactants, a laminate structure is formed containing alternating layers containing elements of the first reactant (and also optionally of the second reactant), and layers containing primarily elements of the second reactant. The second layer is also many times thicker than the first layer. Because the first material is laid down substantially as a monolayer, yet promotes deposition of the much thicker second layer (containing up to 40 monolayers), the first material is referred to as a "catalytic" material or layer.

Alternating layer deposition offers a number of other remarkable capabilities in addition to the control of stoichiometry at an atomic level. The thickness of a film can be set digitally by counting the number of reaction cycles and is substantially immune to variations caused by nonuniform distribution of vapor in the reaction zone. The uniformly thick layers can be easily deposited over large areas and over convoluted geometries, such as inside very narrow holes.

According to one or more embodiments of the present invention, a substrate is alternately exposed to the vapors of one or more reactive catalytic compounds and then an alkoxysilanol, alkoxyalkylsilanol, or alkoxysilanediol. The reactive compound may include metals having Lewis acid character, including but not limited to, compounds containing aluminum, boron, magnesium, scandium, lanthanum, yttrium, zirconium, and hafnium. In one or more embodiments, an aluminum-containing compound serves as the reactive compound. The present invention has surprisingly found that unusually thick silica films are rapidly formed when the substrate is subjected to such a process. In one or more embodiments, silica films having a thickness in the range of about 5 to 15 nm are deposited in a single alternating layer deposition cycle. The alternating layer deposition reaction can deposit a plurality of monolayers in each cycle. The cycle duration can be less than 30 seconds, resulting in a deposition rate that is more than 100 times the rate of previously known atomic layer deposition reactions for silica. It has also been found that use of bis(dialkyl)phosphate doses provides phosphorus content to the films, rendering them useful as sources for phosphorus-doping of materials such as silicon. The nanolaminates have very uniform thickness and excellent step coverage in surface features with aspect ratios over 40:1. See FIG. 6.

The composition of these films is stoichiometric silicon dioxide, along with low levels of aluminum, typically less than 1 atomic %, or about 0.6 atomic %. Carbon is typically present at very low levels (less than 0.3 atomic %). The films are amorphous by x-ray and electron diffraction. The film density is high, e.g., greater the 90% of the value for bulk fused (amorphous) silica. The structure of these conformal films can be described as a nanolaminate, in which very thin layers of alumina are interspersed between thicker layers of silica. Many optical, electrical and mechanical properties of silica, e.g., refractive index, dielectric constant and leakage current, are hardly changed by the presence of a small amount of alumina. However, other properties of silica may benefit from the additional presence of alumina, e.g., resistance to atomic diffusion and electrical breakdown voltage. If higher levels of alumina are desired, it is possible to repeat one or more cycles of alumina deposition (first the aluminum-containing compound, followed by water or alcohol) before each dose of silanol vapor is introduced. Higher levels of alumina can lower the rate of etching by hydrofluoric acid, providing a better match to the rate of etching of thermally oxidized silicon. In silicon semiconductor structures having both a thermally oxidized layer and a silica nanolaminate layer, having nearly equal etch rates for these two materials can provide smoother surfaces following an etch in hydrofluoric acid. Larger percentages of alumina can increase the rate of thermal expansion, so that the rate for the nanolaminate may be adjusted to be close to that of silicon, thereby decreasing thermally-induced stress in a nanolaminate/silicon structure.

The deposition reactions can be carried out using standard apparatus and techniques. Depending on the processing conditions, the alternating layer deposition process discussed in greater detail below may provide both highly conformal films (to provide good step coverage as is desired in a wide range of applications) or, as desired in some embodiments of the present invention, selective deposition on the outer surface of a porous material and/or on the inner surface of the pores just near the surface, or selectively inside holes and trenches.

2. Precursors Providing Silicon and Oxygen.

Suitable silanol compounds for use in the practice of the present invention are provided in Published International Application No. WO 02/27063, which is hereby incorporated in its entirety by reference.

In at least some embodiments, tris(alkoxy)silanol compounds, as discussed herein, have the general formula 1, in which $R^1$ through $R^9$ represent hydrogen, alkyl groups, fluoroalkyl groups or alkyl groups substituted with other non-metallic atoms or groups, preferably selected to maintain the volatility of the compound, where any one of $R^1$ through $R^9$ is the same or different from each other. In some embodiments, the groups $R^1$ through $R^9$ contain between one and four carbons and are the same or different.

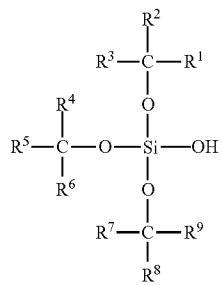

1

In at least some embodiments methyl groups are selected for each of the $R^1$ through $R^9$ in the general formula 1 given above, obtaining the compound tris(tert-butoxy)silanol 2, which may be written more compactly as $(Bu^tO)_3SiOH$.

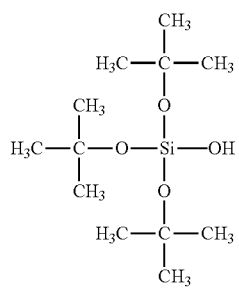

2

Another compound of the invention is tris(tert-pentyloxy) silanol, also known as tris(tert-amyloxy)silanol 3, which may be written more compactly as $(Am^tO)_3SiOH$.

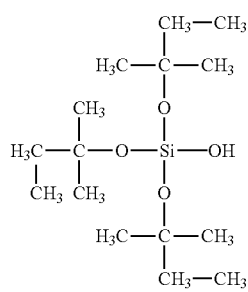

3

In at least some embodiments of the invention di(alkoxy) silanediols such as $(Bu^tO)_2Si(OH)_2$ can also be used, although they are less stable than tris(alkoxy)silanol compounds in at least some applications. Di(alkoxy)silanediol compounds having the general formula 4 may be used according to the invention, in which any of $R^1$ through $R^6$ represents hydrogen, alkyl groups, fluoroalkyl groups or alkyl groups substituted by other non-metallic atoms or groups, preferably selected to enhance volatility and stability, and which may be the same or different.

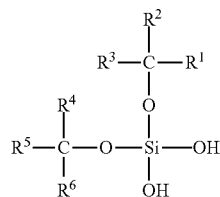

4

In other embodiments di(alkoxy)alkylsilanols having the general formula 5 are used, particularly in making films with dielectric constants lower than silica because the alkyl groups $R^7$ may be retained in the deposited film.

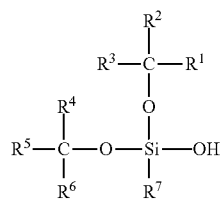

5

In at least some embodiments, the groups $R^1$-$R^9$ for the general formula 1, $R^1$-$R^6$ for the general formula 4 or $R^1$-$R^7$ for the general formula 5 may be selected from the group consisting of hydrogen, methyl, ethyl, n-propyl or isopropyl groups.

In the foregoing compounds, it is also understood that alkyl groups $R^1$ through $R^9$ for general formula 1, $R^1$ through $R^6$ for general formula 4 or $R^1$ through $R^7$ for the general formula 5 may be a hydrocarbon having some degrees of unsaturation, e.g., aryl, alkenyl or alkynyl groups.

Silanol and silanediol reactants are commercially available or may be prepared using conventional or known techniques. One silicon precursor, tris(tert-butoxy)silanol, is commercially available from Aldrich Chemical Company (Milwaukee, Wis.) and Gelest, Inc. (Tullytown, Pa.). Tris(tert-butoxy) silanol may be prepared as follows. First, tris(tert-butoxy) chlorosilane may be prepared by either of the following two reactions:

$$SiCl_4 + 3Bu^tOH \rightarrow (Bu^tO)_3SiCl + 3HCl \quad (1)$$

$$SiCl_4 + 3NaOBu^t \rightarrow (Bu^tO)_3SiCl + 3NaCl \quad (2)$$

The tris(tert-butoxy)chlorosilane is then hydrolyzed according to the reaction $$(Bu^tO)_3SiCl + H_2O \rightarrow (Bu^tO)_3SiOH + HCl \quad (3)$$

See, Backer et al., Rec. Tray. Chim., 61:500 (1942). This hydrolyzed compound, tris(tert-butoxy)silanol, is a solid at room temperature and melts at about 66° C. It sublimes at room temperature at a low pressure of about $10^{-4}$ Torr, and can be distilled at a temperature of about 104° C. at a pressure of 20 Torr. It is highly soluble in organic solvents such as mesitylene or tetradecane, so that its vapors can also be formed conveniently by flash vaporization of its solution.

As would be appreciated by one of ordinary skill in the art, other tris(tert-alkoxy)silanols may be prepared by similar reactions, by substituting other tertiary alcohols, such as tert-pentyl alcohol (also known as tert-amyl alcohol), for tert-butanol. Tris(tert-amyloxy)silanol, $(Am^tO)_3SiOH$, is a liquid at room temperature, so its vapors can be formed conveniently by flash vaporization of the neat liquid. It has a vapor pressure of about 2 Torr at 96° C. It is commercially available from Aldrich Chemical Company (Milwaukee, Wis.).

Tris(tert-alkoxy)silanol or bis(tert-alkoxy)silanediol vapors may be reacted with a suitably reactive vapors of one or more aluminum compounds to deposit a solid film comprising silicon, aluminum and oxygen. Generically, (alkoxy) silanols and (alkoxy)silanediols such as tris(tert-alkoxy)silanols or bis(tert-alkoxy)silanediols are referred to as "silanols."

Also included in the general class of "silanols" are compounds in which a tert-alkoxy group in a tris(tert-alkoxy) silanol or bis(tert-alkoxy)silanediol is replaced by an alkyl group or a substituted alkyl group such as a partially fluorinated alkyl group. Silanols with an alkyl group directly bound to the silicon bring that alkyl group into the deposited film, giving it properties that are desirable in some applications, such as low dielectric constant, low refractive index and low stress. For example, bis(tert-butoxy)alkylsilanols can be prepared starting with either of the following two reactions:

$$RSiCl_3 + 2Bu^tOH + 2 \text{ pyridine} \xrightarrow{\text{pyridine}} (Bu^tO)_2RSiCl + 2HCl \quad (4)$$

$$RSiCl_3 + 2NaOBu^t \rightarrow (Bu^tO)_2RSiCl + 2NaCl \quad (5)$$

followed by hydrolysis of the chloride:

$$(Bu^tO)_2RSiCl + H_2O \rightarrow (Bu^tO)_2RSiOH + HCl \quad (6)$$

See, H.-J. Holdt et al., Z. Chem, 23:252 (1983) for a description of these reactions. Bis(tert-butoxy)methylsilanol prepared in this way has a vapor pressure 32 Torr at a temperature of 87° C.

3. Precursors Containing Aluminum or Other Lewis Acids.

In at least some embodiments, aluminum amides are useful in the practice of this invention. Some examples of aluminum amides are given in Table 1, as well as a listing of available commercial sources and/or literature references for their synthesis. Further information regarding suitable aluminum amide compounds is found in Published International Application No. WO 02/27063, which is incorporated by reference.

TABLE 1

Some Volatile Aluminum Amides

| Compound | Melt. Pt. ° C. | Vapor Press. ° C./Torr | Reference and/or commercial source |
|---|---|---|---|
| $Al(N(SiMe_3)_2)_3$ | 188 | | Wannagat, J. Organomet. Chem. 33, 1 (1971) |
| $Al_2(NEt_2)_6$ | liquid | | S. Barry & R. G. Gordon, 2000 |
| $Al_2(NEtMe)_6$ | liquid | 100/0.25 | S. Barry & R. G. Gordon, 2000 |
| $Al(N^iPr_2)_3$ | 56-59 | | Brothers, Organometallics 13, 2792 (1994) |
| $Al_2(NMe_2)_6$ | 88-89 | 90/0.1 | Ruff, JACS 83, 2835 (1961); Aldrich |
| $Al(N(Et)CH_2CH_2NMe_2)(NMe_2)_2$ | liquid | 65-70/0.3 | Barry, Gordon & Wagner, Mat. Res. Soc. Symp. Proc. 606, 83-89 (2000) |

Where Me = methyl; Et = ethyl; and $^iPr$ = isopropyl.

In at least some embodiments, aluminum alkyls are useful in the practice of this invention. Some examples are given in Table 2, as well as a commercial source or literature reference of their synthesis.

TABLE 2

Some Volatile Organoaluminum Compounds

| Compound | Melt. Pt. ° C. | Vapor Press. ° C./Torr | Commercial Sources |
|---|---|---|---|
| $AlMe_3$ | 15.4 | 20/8 | Albemarle, Aldrich, Strem |
| $AlEt_3$ | −50 | 129/50 | Albemarle, Aldrich, Alfa, Strem |
| $Al(^iBu)_3$ | 5 | 86/10 | Albemarle, Aldrich, Alfa, Strem |

Where Me = methyl Et = ethyl; and $^iBu$ = isobutyl.

In at least some embodiments, aluminum alkoxides can be used in the practice of this invention. Suitable compounds are listed in Table 3, as well as commercial sources.

TABLE 3

Some Volatile Aluminum Alkoxides

| Compound | Melt. Pt. ° C. | Vapor Press. ° C./Torr | Commercial Sources |
|---|---|---|---|
| $Al_2Et_3(O\text{-sec-Bu})_3$ | liquid | 190/0.1 | Strem |
| $Al(O^iPr)_3$ | 140 | 140.5/8 | Aldrich, Alfa, Gelest, Strem |

Where Me = methyl; $^iPr$ = isopropyl and sec-Bu = sec-butyl.

Aluminum halides, such as aluminum chloride, may also be used in the practice of this invention, but they have the potential disadvantages that they tend to leave some halide impurity in the film and cause corrosion of substrates or apparatus.

In addition, other metals having a Lewis acid character may be used in the practice of this invention. For example, compounds that contain a Lewis acid metal including, but not limited to, magnesium, boron, scandium, lanthanum, yttrium, zirconium, and hafnium, are within the scope of this invention. The alternating layer deposition process has been used to form metal-doped silica using lanthanum, zirconium, and hafnium instead of aluminum.

4. Additional Oxygen-Containing Precursors and Other Precursors.

In at least some embodiments, some of the silanol doses are replaced with water in order to deposit more aluminum-rich silica/alumina nanolaminates. In a CVD reactor, water vapor tends to react very quickly with the vapors of the metal precursors near the vapor entrance to produce powder, rather than film on the substrate. In an alternating layer deposition reactor, such premature reactions are typically avoided because the reactants are introduced alternately into the reactor, so reactions near the entrance are prevented and reaction is generally confined to the surface of the substrate. However, since water tends to adsorb strongly on surfaces, lengthy purging of the alternating layer deposition reactor between pulses of the reactants may be required. When water is used as an additional oxygen source, it is recommended that the supply lines for water vapor be heated to temperatures at least about 120° C. to avoid physical adsorption of water vapor.

Optionally, alcohols such as isopropanol and tert-butanol may be used. The reactions of alcohols with aluminum compounds are slower than for water and the more volatile alcohols can be pumped quickly from an alternating layer deposition reactor. Alcohols such as isopropanol and tert-butanol are particularly appropriate for reactions involving thermally stable aluminum compounds. In some cases, the substrate temperature is raised in order to decompose the alcohols and thereby reduce the carbon content of the film.

In another aspect of the invention, vapors of phosphate compounds, e.g., bis(alkyl)phosphates, are reacted with the vapors of reactive aluminum compounds, such as aluminum alkylamides, alkyls, cyclopentadienides or alkoxides, to form aluminum phosphates. The reaction may be carried out in a way that forms films. Using some doses of silanol and others of bis(dialkyl)phosphates, alternating with doses of reactive aluminum compounds gives films comprising silicon, oxygen, aluminum and phosphorus. For example, after exposure to the silanol and aluminum compound, the substrate may be further exposed to a bis(alkyl)phosphate having the formula

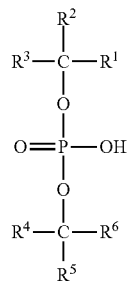

where $R^1$ through $R^6$ represent hydrogen, alkyl groups, fluoroalkyl groups or alkyl groups substituted by other non-metallic atoms or groups, and any one of the groups $R^1$ through $R^6$ are the same or different. In some embodiments, the groups $R^1$ through $R^6$ contain between one and four carbons, and in other embodiments, the groups $R^1$, $R^3$, $R^4$ and $R^6$ are methyl groups and groups $R^2$ and $R^5$ are hydrogens.

5. Vaporization of Reactants and Product Deposition.

Vapors of liquid precursors may be formed by conventional methods, including heating in a bubbler, in a thin-film evaporator, or by nebulization into a carrier gas preheated to about 100 to 200° C. The nebulization may be carried out pneumatically, ultrasonically, or by other another suitable method. Solid precursors may be dissolved in organic solvents, including hydrocarbons such as decane, dodecane, tetradecane, toluene, xylene and mesitylene, and with ethers, esters, ketones and chlorinated hydrocarbons. Solutions of liquid precursors generally have lower viscosities than the pure liquids, so that at least some embodiments nebulize and evaporate solutions rather than the pure liquids. The liquids or solutions may also be evaporated with thin-film evaporators or by direct injection of the liquids into a heated zone. Commercial equipment for vaporization of liquids is made by MKS Instruments (Andover, Mass.), ATMI, Inc. (Danbury, Conn.), Novellus Systems, Inc. (San Jose, Calif.) and COVA Technologies (Colorado Springs, Colo.). Ultrasonic nebulizers are made by Sonotek Corporation (Milton, N.Y.) and Cetac Technologies (Omaha, Nebr.).

The silicon precursors of the present invention may be reacted with aluminum amides, such as those in Table 1, to form silica/alumina nanolaminates. For example, tris(tert-butoxy)silanol may be reacted with hexakis(dimethylamido) dialuminum (Table 1) to form silica/alumina nanolaminates (Example 7). In some embodiments, the silicon precursors of the present invention may be reacted with organoaluminum compounds, such as those in Table 2, to form silica/alumina nanolaminates. In other embodiments, the silicon precursors of the present invention may be reacted with aluminum alkoxides, such as those in Table 3, to form silica/alumina nanolaminates. In yet other embodiments, the silicon precursors of the present invention may also be reacted with other suitably reactive aluminum compounds, such as aluminum halides, to form silica/alumina nanolaminates.

Alternating layer deposition introduces a metered amount of a first reactant into a deposition chamber having a substrate therein for layer deposition. A thin layer of the first reactant is deposited on the substrate. After a preselected time period, during which excess of the first reactant us removed from the chamber, a metered amount of a second reactant is then introduced into the deposition chamber. The second reaction may be provided in an amount that saturates the substrate surface. It has been determined that high doses of the silanol are required to saturate the substrate surfaces containing deposited metal or metalloid compound. The dose of alkoxysilanol or alkoxysilanediol vapor (measured in moles/cm$^2$) is at least ten (10) times greater than the dose of metal or metalloid compound (in moles/cm$^2$), and can be up to 100 times greater or more. The second reactant is deposited on and interacts with the already deposited layer of the first reactant. Alternating layers of first and second reactants are introduced into the deposition chamber and deposited on the substrate to form a layer of controlled composition and thickness. Alternation of reactants may be on the order of seconds to minutes and is selected to provide adequate time for the just-introduced reactant to deposit on the substrate and for any excess vapor to be removed from the headspace above the substrate. It has been determined that the surface reactions are self-limiting so that a reproducible layer of predictable composition is deposited. As will be appreciated by one of ordinary skill in the art, deposition processes utilizing more than two reactants is within the scope of the invention. For example, the first reactant can be exposed to an oxidant source to convert the metal amide, metal alkyl, metal alkoxide or metal halide into a metal oxide or metal hydroxide. The oxidant source can be water or an organic alcohol.

In one embodiment of the invention, the process is carried out in an apparatus having 6-port sampling valves (Valco model EP4C6WEPH, Valco Instruments, Houston, Tex.) normally used for injecting samples into gas chromatographs may be used to deliver pulses of liquids or solutions into a suitable carrier gas. Each time that a valve is opened, solution flows into a tube in which solution is vaporized by heat from hot oil flowing over the outside of the tube. Carrier gas moves the vapor from the tube into the alternating layer deposition reactor tube.

In another embodiment, a layer is deposited by alternating layer deposition using an apparatus such as that illustrated in FIG. 1. According to at least some embodiments, measured doses of reactant vapor 30 are introduced into the heated deposition chamber 110 by the use of a pair of air-actuated diaphragm valves, 50 and 70 (Titan II model made by Parker-Hannifin, Richmond Calif.). The valves are connected by a chamber 60 having a measured volume V, and this assembly is placed inside an oven 80 held at a controlled temperature $T_2$. The pressure of the reactant vapor 30 in the precursor reservoir 10 is equal to the equilibrium vapor pressure $P_{eq}$ of the solid or liquid reactant 20 at a temperature $T_1$ determined by the surrounding oven 40. The temperature $T_1$ is chosen to be high enough so that the precursor pressure $P_{eq}$ is higher than the pressure $P_{dep}$ in the deposition chamber. The temperature $T_2$ is chosen to be higher than $T_1$ so that only vapor and no condensed phase is present in the valves 50 and 70 or the chamber 60. In the case of a gaseous reactant, its pressure can be set by a pressure regulator (not shown) that reduces its pressure from the pressure in the precursor gas cylinder 10.

A similar arrangement is provided for each reactive precursor introduced into the deposition chamber 110. Thus, a precursor reservoir 11 holds a solid or liquid reactant 21 having a vapor pressure 31 at a temperature $T_1'$ maintained by surrounding furnace 41. Valves 51 and 71 are connected by a chamber 61 having a measured volume V' and this assembly is housed in oven 81 at temperature $T_2'$.

Carrier gas (such as nitrogen gas) flows at a controlled rate into inlets 90 and 91 in order to speed the flow of the reactants into the deposition chamber and the purging of reaction byproducts and un-reacted reactant vapor. A static mixer may be placed in the tubing 100 leading into the reactor, to provide a more uniform concentration of the precursor vapor in the carrier gas as it enters the deposition chamber 110 heated by furnace 120 and containing one or more substrates 130. The reaction byproducts and un-reacted reactant vapors are removed by trap 140 before passing into a vacuum pump 150. Carrier gas exits from exhaust 160.

In operation, valve 70 is opened so that the pressure inside chamber 60 is reduced to a value $P_{dep}$ close to that of the deposition chamber 110. Then valve 70 is closed and valve 50 is opened to admit precursor vapor from precursor reservoir 10 into chamber 60. Then valve 50 is closed so that the volume V of chamber 60 contains vapor of the precursor at a pressure $P_{eq}$. Finally, valve 70 is opened to admit most of the precursor vapor contained in chamber 60 into the deposition chamber. The number of moles, n, of precursor delivered by this cycle can be estimated by assuming that the vapor obeys the ideal gas law:

$$n = (P_{eq} - P_{dep})(V/RT_1) \quad (7)$$

where R is the gas constant. This expression also assumes that carrier gas from tube 90 does not enter chamber 60 through valve 70 during the brief time that it is open to release the precursor vapor. If mixing of carrier gas with the precursor vapor does occur during the time that valve 70 is open, then a larger dose of precursor vapor may be delivered, up to a maximum value $$n = (P_{eq})(V/RT_1) \quad (8)$$

if all the residual precursor vapor in chamber 60 is displaced by carrier gas. For precursors with relatively high vapor pressure ($P_{eq} \gg P_{dep}$), there is usually not much difference between these two estimates of the precursor dose.

This cycle of delivering precursor 20 is repeated if necessary until the required dose of precursor 20 has been delivered into reaction chamber. Typically, in an alternating layer deposition process, the dose of precursor 20 delivered by this cycle (or several such cycles repeated to give a larger dose) is chosen to be large enough to cause the surface reactions to go to completion (also called "saturation"). Carrier gas continues to flow, typically for a few seconds, after delivery of precursor vapor 60, until any excess vapor has been removed from the chamber.

Next a dose of vapor 31 from a second precursor 21 may be measured and delivered by a similar apparatus with components numbered similarly to the apparatus for the first precursor 20.

Figure 2:
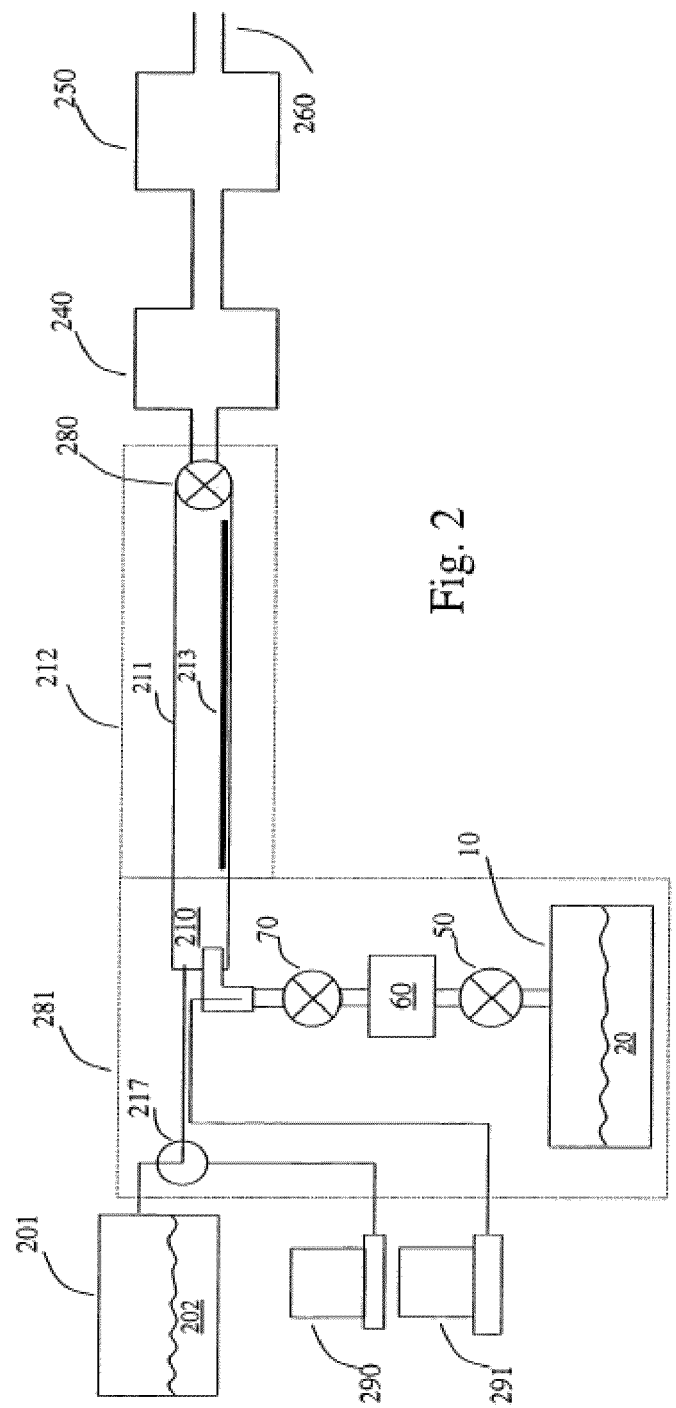
FIG. 2 is a cross-sectional illustration of an alternating layer deposition apparatus used in the practice of at least one embodiment of the invention.

Another way in which a precursor dose may be delivered into the deposition zone is shown schematically in FIG. 2. A first dose of reactant 20 is delivered from reservoir 10 through valves 50 and 70 and chamber 60, as described above. A second precursor 202 is contained in reservoir 201. Its vapor flows through 3-way valve 217 into the mixing zone 210 and then over the substrate 213 inside chamber 211 in heated zone 212. When a sufficient dose has been delivered, the 3-way valve 217 is turned into its other position so that nitrogen purge gas flows from mass-flow controller 290 into the deposition chamber 211, sweeping away any excess reactant vapor into trap 240, while the nitrogen flows into the vacuum pump 250 and out the exhaust 260. The size of the dose is controlled by the length of time during which the 3-way valve 217 is held in the delivery position. Carrier gas flows continuously from mass flow controller 291.

In an isothermal deposition zone 211, material is generally deposited on all surfaces exposed to the precursor vapors, including substrates and the interior chamber walls. Thus it is appropriate to report the precursor doses used in terms of moles divided by the total area of the substrates and exposed chamber walls. In some cases, deposition also occurs on part or all of the backside of the substrates, in which case that area should also be included in the total area.

The aluminum precursors generally react with oxygen or moisture in the ambient air, and should be stored under an inert, dry atmosphere such as pure nitrogen gas. The silicon precursors are generally stable and non-reactive to air and water.

6. Conformal Coating or Filling of Holes and Trenches.

Silica nanolaminate layers may also be deposited within holes and trenches to form uniform conformal layers throughout the depth of the hole or trench. In one or more embodiments, the holes or trenches are conventionally formed by using photolithography to mask parts of a surface, and then anisotropically etched (e.g., by a reactive ion beam) to remove the materials from the holes or trenches under areas that are not protected by the photolithographic mask. The mask layer is removed prior to processing of the substrate to expose the substrate surface. A thin aluminum oxide layer is deposited on the walls of the hole or trench as well as on the flat surface of the substrate. This deposition can be by an atomic layer deposition reaction, for example, using trimethylaluminum vapor, optionally followed by water vapor. The alumina-coated substrate surface and the holes and trenches contained within are then exposed to a silanol vapor such as tris(tert-butoxy)silanol, which reacts catalytically with the aluminum oxide layer to form a conformal layer of silica/alumina nanolaminate. This alternating cycle of vapors can be repeated to deposit thicker conformal silica nanolaminate layers. A sufficient number of layers will completely fill a hole provided that its cross-section does not increase as a function of its depth.

In another embodiment, a thin silica layer is deposited within holes and trenches without at the same time depositing on flat surfaces adjacent to the openings to these holes or trenches. The holes or trenches are conventionally formed by using photolithography to mask parts of a surface, and then anisotropic etching (often by a reactive ion beam) removes the material from the holes or trenches under areas that are not protected by the photolithographic mask. In a process according to one embodiment of the invention, a thin aluminum oxide layer is deposited on the walls of the hole or trench as well as on the surface of the mask layer. This deposition can be by an atomic layer deposition reaction, such as using trimethylaluminum vapor and then water vapor.

Next the mask is removed by chemically selective etching that does not remove the deposited aluminum compound. During the removal of the mask, the aluminum oxide on its surface is also removed, but the aluminum oxide remains on the inner surfaces of the hole or trench. Finally, the structure is exposed to vapor of a reactive silanol such as tris(tert-butoxy)silanol, which reacts catalytically with the aluminum oxide layer. The result is a thin silica layer deposited only on the inside surface of the holes and trenches, but not on the upper flat surface that had been covered by the mask layer but which is now exposed substrate. This process can be used to insulate electrically the inner surfaces of holes or trenches without depositing unnecessary material on the upper surface. For very narrow holes or trenches (less than about 30 nm wide), the hole or trench may be filled completely with silica in one step.

Figure 3:
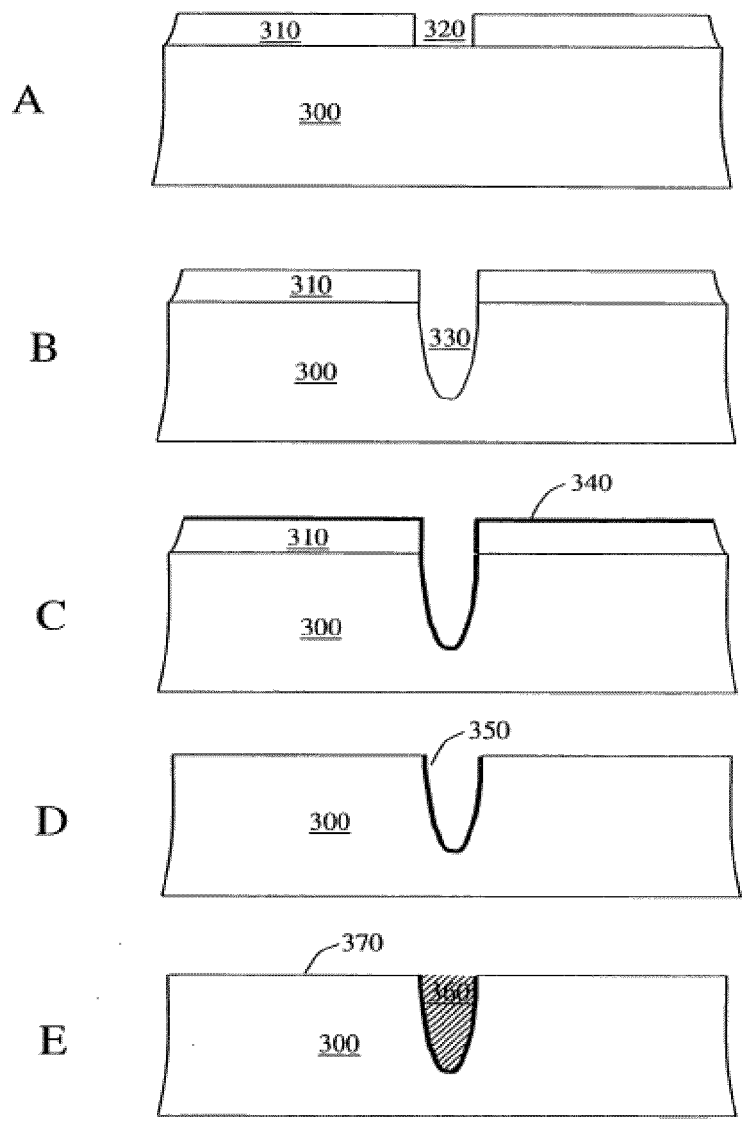
FIGS. 3A-3E are cross-sectional illustrations of a silicon wafer having a hole or trench, wherein a silica layer is deposited in the hole or trench without at the same time depositing on flat surfaces adjacent to the hole or trench.

FIG. 3. illustrates this process. FIG. 3A shows a cross-section of a silicon wafer 300 covered by an etch-mask layer 310 that has been photo-lithographically patterned to remove regions such as 320. Reactive ion etching removes silicon from a hole or trench 330, as shown in FIG. 3B. Next one or a few atomic layer deposition cycles are used to deposit a thin layer of aluminum oxide 340 covering the inside of the hole or trench, as well as the etch mask 310, as shown in FIG. 3C. Then the etch mask is removed by etching, during which process the aluminum oxide on the etch mask is also removed because the material under the aluminum oxide has been dissolved. This leaves the structure shown in FIG. 3D in which aluminum oxide remains only as a coating inside the hole or trench 350. In last step, the structure is heated and exposed to a silanol vapor, so that silica 360 is deposited inside the hole or trench, but not on the top surface 370, which remains free of silica (except for a very thin native silica layer). Because the mask layer is removed prior to deposition of silica, the "dishing" effect observed using prior art methods is avoided.

It may be advantageous to make the material filling the trench into a better barrier to the diffusion of boron, oxygen, or other impurities potentially deleterious to the silicon. Aluminum oxide is a good barrier to diffusion. Thus it may be advantageous to deposit a thicker layer (more than just a mono-layer) of alumina before completing the trench filling with silica or a low-k material. The diffusion barrier can be made by completing several cycles of atomic layer deposition using an aluminum precursor alternating with a precursor for oxygen, such as water, alcohol or ozone, before providing the silanol dose to complete the filling of the trenches.

Additional aluminum oxide can be added to the nanolaminate material by repeating alumina-depositing cycles (e.g., aluminum source then oxygen source) before going on to the next silanol dose. The cycles for additional alumina could be, for example, trimethylaluminum vapor and water vapor.

The nanolaminate as deposited by alternating an aluminum source and a silanol has a higher etch rate in hydrofluoric acid solution than does "thermal oxide" (i.e. silica grown by heating single-crystal silicon). In applications such as shallow trench isolation, it is desirable that the HF etch rate of the deposited insulator match that of thermal oxide, a layer of which is normally present on the silicon prior to trench-filling by the insulator. Adding alumina decreases the etch rate of the nanolaminate in hydrogen fluoride. Thus a nanolaminate enriched in alumina can be adjusted to have an etch rate similar to that of thermal oxide. It should be noted that high-temperature annealing also reduces the etch rate of the alternating layer deposition nanolaminates of this invention. Thus additional alumina can be used along with thermal annealing to adjust the etch rate of the nanolaminate.

Shallow trench isolation structures are always subject to thermal annealing during later steps in the fabrication of microelectronic devices. Since the thermal expansion rate of the nanolaminate is smaller than that of single-crystal silicon, annealing can introduce thermal stress between the silicon and the nanolaminate. Increasing the alumina content of the nanolaminate increases its thermal expansion rate, so that enrichment in alumina can reduce the thermal stress during annealing. The trench filling silica nanolaminate can include alumina in an amount sufficient to match the thermal coefficient of expansion of the substrate.

7. Vapor Deposition of Secondary Dielectric to Seal Porous Dielectric Material.

In one aspect, the present invention provides materials and processes for producing superior dielectric materials possessing desired low density and low-k characteristics without certain processing problems associated with porosity of the dielectric material. Specifically, using the deposition processes of the invention, surface porosity of the porous dielectric material is significantly reduced or eliminated while internal porosity is preserved to maintain a desired low-k value for the overall dielectric material.

Figure 4:
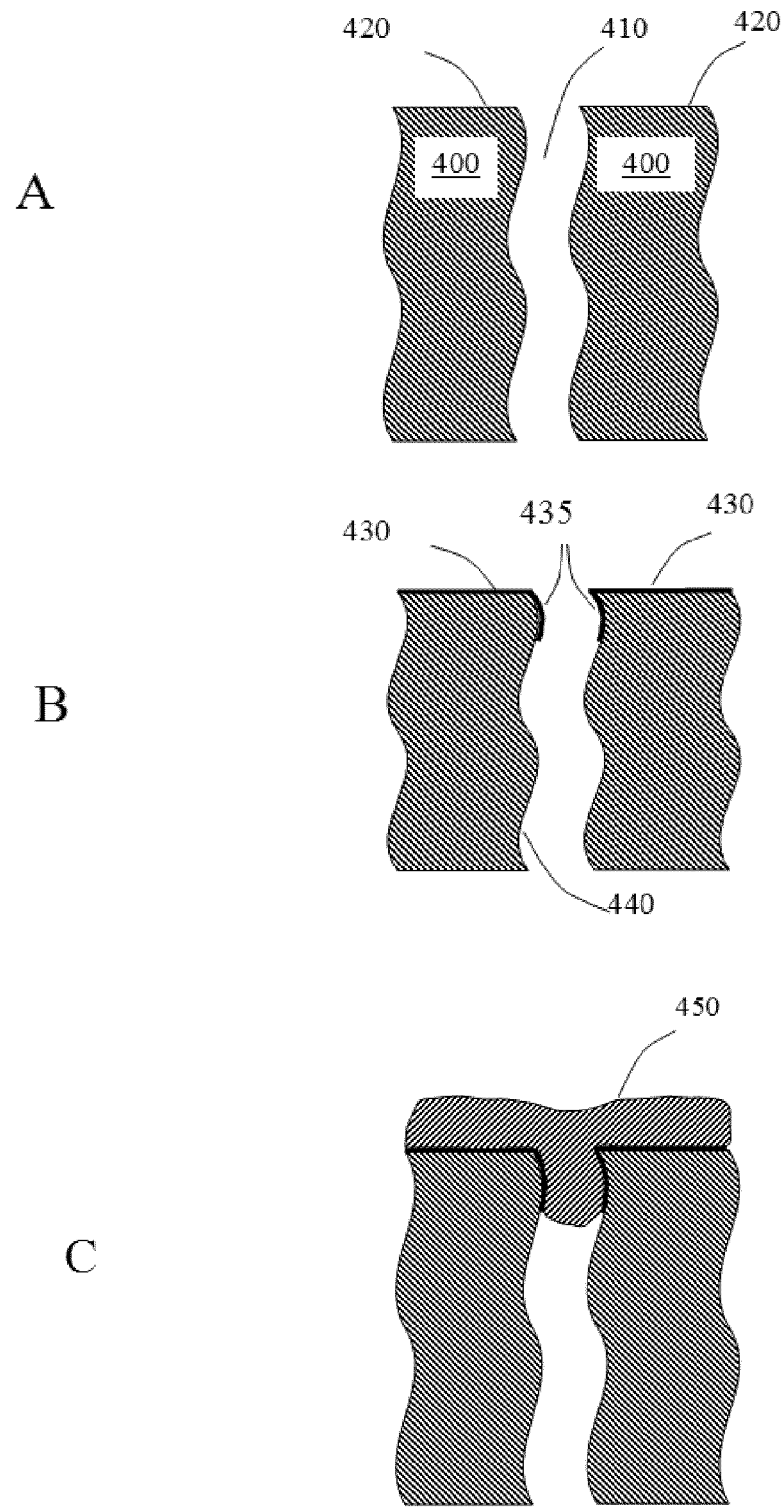
FIGS. 4A-4C are cross-sectional illustrations of (A) a dielectric material having a pore to which (B) a thin catalytic layer has been deposited on portions of the outer surface of the dielectric material and sidewalls of the pore, and to which (C) a material having a relatively low dielectric constant is subsequently deposited such that it reacts with the thin catalytic layer to form a seal over the opening of the pore and the adjacent outer surface of the dielectric material.

The steps in carrying out this embodiment may be understood by reference to FIG. 4. FIG. 4A shows a schematic cross-section of material 400 having pores such as the one denoted by 410. Material 400 may comprise any of a number of porous low-k materials currently under development, including but not limited to hydrogen silsesquioxane, methyl silsesquioxane, aerogels, xerogels, SiCxOHy, SiLK® (Dow Chemical), CORAL® (Novellus), Black Diamond® (Applied Materials), and CVD-deposited methyl silanes, etc. Generally, these porous dielectrics contained an interconnected network of pores, some of which extend from the inner bulk material to the outer surface of the dielectric, and others that are wholly contained within the bulk material. All of the pores reduce the density and dielectric constant of the material. The pores with the most deleterious effects are ones that are open to the outer surface 420 of the material, since these pores can produce electrical short circuits when electrically conductive materials are applied to the porous dielectric using atomic layer deposition or another deposition method with good step coverage.

In carrying out this embodiment, the surface pores of a porous dielectric material are sealed with a second insulating material 450 such as silica or other insulating or low-k material without filling the interior spaces of the pores. To seal off these surface pores of a porous dielectric, thin catalytic layers 430 and 435 are first deposited on the surface and the pore sidewalls that are proximal to the surface. The catalytic material can be an aluminum-containing material that is deposited in a process that has "poor" step coverage (e.g. non-conformal coating of the sidewalls and any interior space or surface of the pores or trenches). In this way the catalytic layer 430 is deposited on the outer surface 420 of the porous material and as a layer 435 on the inner surface of pores just near to the surface. The deeper interior surfaces 440 of the pores are left free of catalyst.

As would be appreciated by one of skill in the art, such "good step coverage" or "poor step coverage" may readily be obtained by adjusting the reaction conditions and reactant reactivity. For instance, atomic layer deposition may be utilized under conditions where the exposure of the vapor to the substrate surface is brief, the dose of reactants is limited, and high vacuum pumping speed is used to limit the penetration of the reactant materials to the portions of the pores near the surface (e.g., where the pores or trenches are defined by at least one sidewall and an interior space, the penetration is controlled such that only the top portions of the sidewalls are coated with the reactants). Alternatively, the deposition process having "poor" step coverage can be a physical deposition method such as sputtering or evaporation, or a CVD process run under conditions giving poor step coverage.

In certain embodiments, the present invention is directed to depositing coatings, particularly those made predominantly of silicon dioxide, on a porous substrate. In certain embodiments, these coatings comprise silicon dioxide, relatively small amounts of aluminum, and optionally, may contain carbon and hydrogen, and relatively small amounts of other elements (e.g., dopants). For example, one dose of a silanol precursor is supplied to a porous substrate previously coated with a catalyst as in FIG. 4B. This process allows for the formation of enough low-k material 450 to fill the surface pores, while no low-k material is formed on the interior surfaces of the pores that lack the aluminum oxide catalyst. Using this method, even large surface pores are filled by one dose of silanol. For example, if tris(tert-butoxy)silanol, $(Bu^tO)_3SiOH$, is used, then pores up to 30 nm diameter can be completely filled in one dose. Since pores in typical ultralow-k dielectric materials are not more than 10 nm in diameter, there is an adequate safety margin so that even a few excessively large pores would be filled. Methylbis(tert-butoxy)silanol, $Me(Bu^tO)_2SiOH$, can fill the surface pores with a material that has a lower dielectric constant than silica.

Figure 5:
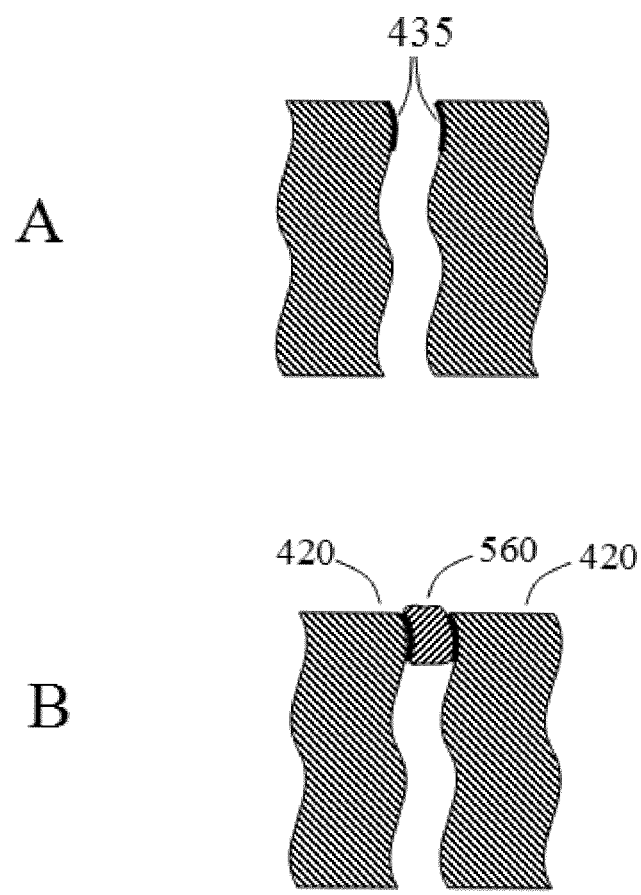
FIGS. 5A-5B are cross-sectional illustrations of (A) a dielectric material having a pore to which a thin layer of catalytic material has been deposited, and a catalytic material deposited on the outer surface of the dielectric material adjacent the pore opening has been removed such that the catalytic material remains primarily within the upper portions of the sidewalls of the pore, and to which (B) a material having a relatively low dielectric constant is subsequently deposited such that it reacts with the thin catalytic layer to form a seal over the opening of the pore.

With the use of one additional step, the deposition of the pore-filling dielectric can be accomplished with the addition of less material than with the previous embodiment. The additional step follows the deposition of the alumina catalyst layer 430 and 435. The aluminum oxide catalyst 430 is removed from the outer surface 420 of the low-k material, while leaving the catalyst 435 inside the outer portion of the pores that need to be filled. The resulting structure is shown in FIG. 5A. In one embodiment, this could be done by reactive ion etching under conditions that etch only the most exposed portions 430 of the catalyst. Then exposure to a silanol vapor forms low-k material 560 mainly within the outer part of the pores and not on the areas 420 of the surface, as shown in FIG. 5B. The resulting structure has a lower dielectric constant than the one shown in FIG. 4C that is produced without the removal of the portion 430 of the catalyst.

The invention may be understood with reference to the following examples which are for the purpose of illustration only and which are not limiting of the invention, the full scope of which is set forth in the claims which follow.

Example 1

Alternating Layer Deposition of Silica/Alumina Nanolaminate

The apparatus of FIG. 2 was used to deposit silica/alumina nanolaminate films. Tris(tert-butoxy)silanol ("silanol") was placed in a stainless steel container 201 and heated to 150° C., at which temperature it has a vapor pressure of about 100 Torr. Trimethylaluminum ("TMA") was held in container 20 at 20° C., so that its vapor pressure was about 14 Torr. A silicon substrate 213 containing holes 7 μm deep and 0.1 to 0.2 μm in diameter was prepared by dissolving its native oxide by placing it in dilute hydrofluoric acid solution for a few seconds. Next the substrate was irradiated by ultraviolet light (e.g. UV mercury lamp) in air until the surface became hydrophilic (about two minutes). Then the substrate 213 was placed in chamber 211 and heated to a temperature of 250° C.

To deliver pulses of TMA vapor, a three-way valve 217 with inner channels 0.4 mm inner diameter, was opened to TMA vapor for 1 second, during which time $1\times10^{-6}$ moles of TMA vapor flowed into the deposition chamber. Incidentally, the area of the substrate 213 and the heated walls of chamber 211 add up to about $10^3$ square centimeters. Thus, a dose of TMA was $1\times10^{-9}$ moles/cm$^2$. Then the three-way valve 217 was turned to allow the flow nitrogen gas for 5 seconds to purge the chamber of residual un-reacted TMA vapor. Next the nitrogen flow was turned off and the deposition chamber was evacuated for 15 seconds by vacuum pump 250. To deliver silanol vapor, the bottom on-off valve 50 was opened for 1 second to fill the volume 60 with silanol vapor at its equilibrium vapor pressure. The bottom on-off valve 50 and the valve 280 between the vacuum pump 250 and the deposition chamber were then closed. The on-off valve 70 on top of volume 60 was then immediately opened to allow $1\times10^{-7}$ moles/cm$^2$ of silanol vapor to enter the deposition chamber 211. After 15 seconds, the top on-off valve 70 was closed, the on-off valve 280 to the vacuum pump 250 was opened, and nitrogen was flowed for 5 seconds to purge the chamber of excess silanol as well as volatile byproducts of the reaction. This cycle was then repeated 3 more times.

After these 4 cycles were completed, the substrate 213 was removed from the reactor. The substrate was examined by ellipsometry and found to have a film with uniform thickness 49 nm and refractive index 1.46. Considering that the silicon substrate had a native silica film about 1 nm thick on it before deposition, each of the 4 cycles was calculated to have deposited about 12 nm of film. The average chemical composition of the film was determined to be about 99 mole % $SiO_2$ and 1 mole % $Al_2O_3$. Thus, each cycle deposited about $4\times10^{-8}$ moles/cm$^2$ of $SiO_2$ and $4\times10^{-10}$ moles/cm2 of $Al_2O_3$. In other runs where higher doses of trimethylaluminum or of silanol were used, up to 15 nm silica/cycle were deposited.

The film developed according to the foregoing possessed very desirable, smooth surface characteristics. Atomic force microscopy confirmed that the surface smoothness of the deposited layer was very similar, if not equal to that of the substrate on which it was deposited.

Figure 6:
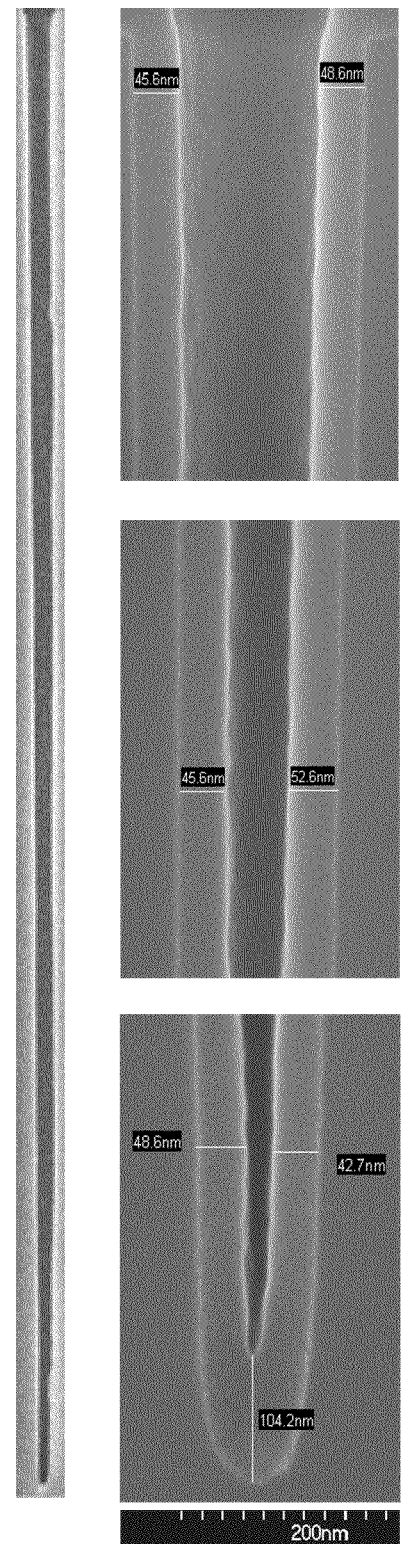
FIG. 6 is a cross-sectional scanning electron micrograph of a hole in a silicon wafer that is uniformly coated with silica/alumina nanolaminate using one embodiment of the invention.

A scanning electron micrograph (SEM) was taken of the cleaved, coated wafer, in order to show the cross section of the silica-coated hole in FIG. 6. FIG. 6A shows the SEM of a complete uncoated hole. FIG. 6B shows the SEM images under higher magnification of the top, middle and bottom of a hole coated with a uniform silica film about 46 nm thick. These data show that the walls of the very narrow hole are covered with a perfectly conformal coating. The narrowest portion of the hole, at its bottom, is completely filled with silica.

Although the invention is not bound by theory or mode of operation, it is proposed that certain chemical reactions occur during the process of the invention. In the first half-reaction, trimethylaluminum reacts with a hydroxylated surface by reactions such as the one shown in FIG. 7A, resulting in chemisorption of aluminum and elimination of byproduct methane gas. During the second half-reaction, tris(tert-butoxy)silanol, $(Bu^tO)_3SiOH$ (abbreviated as "silanol"), reacts with the methylaluminum-containing surface left from the first half-reaction; the silanol becomes chemically bound to the surface and eliminates methane by reactions such as the one shown in FIG. 7B. An additional silanol molecule then diffuses up to the surface and inserts into an aluminum-oxygen bond by the concerted mechanism sketched in FIG. 7C. Repeated insertions of silanols into the Al—O bond form a siloxane polymer bound to the surface through the aluminum, which catalyzes this polymerization, as indicated in FIG. 7D.

This siloxane polymer is attached to the surface by strong chemical bonds and therefore is non-volatile; thus, it is postulated that the conversion of the volatile silanol to non-volatile siloxane polymer is an irreversible chemisorption process. Because the silanol can diffuse through this soft surface-bound siloxane polymer, the catalytic aluminum atoms remain available to catalyze the polymerization of more silanol molecules. The rate-limiting step in this process is the catalytic conversion of silanol to siloxane, provided that the concentration of silanol vapor is high enough to keep the catalytic aluminum centers fully occupied; thus, the chemisorption rate does not depend on the rate at which silanol arrives at the surface of the siloxane layer. In the language of chemical kinetics, the chemisorption rate is zero-order in the vapor concentration of silanol. This condition is important in making uniformly thick films, regardless of, and independent of any non-uniformities that may exist during the distribution of silanol vapor over the surface.

Figure 7:
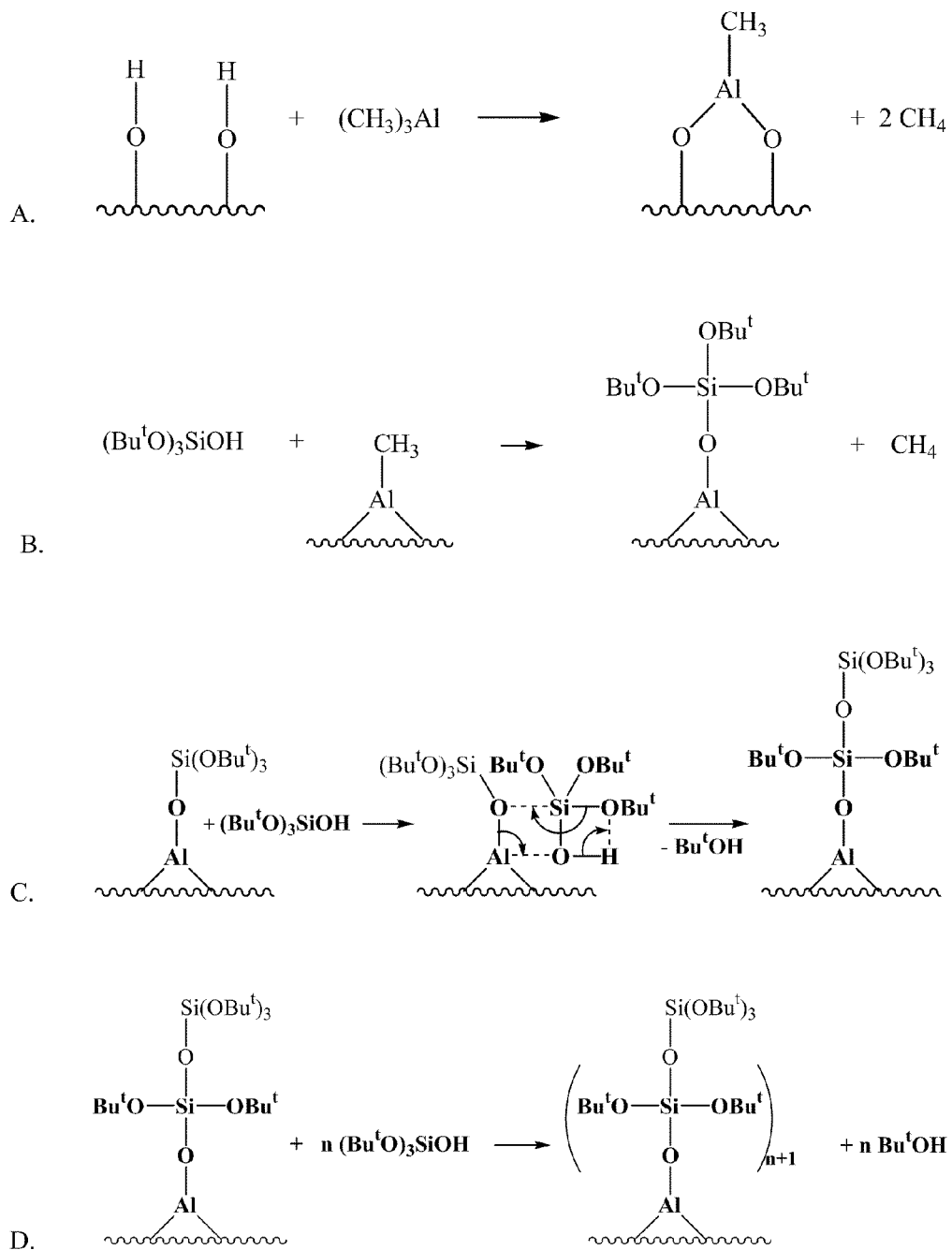
FIGS. 7A-7G illustrate representative chemical reactions that are proposed to operate during at least one embodiment of the invention.

The tert-butyl groups on the siloxane decompose thermally by β-hydrogen elimination of isobutene, leaving hydroxyl groups on the silicon, as indicated in FIG. 7E. A newly-formed hydroxyl group may transfer a hydrogen atom to a nearby butoxy group, eliminating tert-butanol and cross-linking the silicon atoms by an oxygen atom, by reactions such as the one drawn in FIG. 7F. This cross-linking may also be achieved by elimination of water between two adjacent hydroxyl groups, as in FIG. 7G. These cross-linking reactions connect the siloxane polymer chains, causing the polymer layer to gel and eventually solidify to silica ($SiO_2$). Because the silanol presumably has a negligible rate of diffusion through solid silica, additional silanol can no longer reach the catalytic aluminum atoms, so the chemisorption of silanol finally stops (becomes self-limited). Sufficient hydroxyl groups remain on the surface of the silica layer so that the cycle may be begun again by the reaction of the next dose of trimethylaluminum with the hydroxylated surface.

Example 2

Example 1 was repeated, except that the exposure time to silanol vapor was increased from 15 seconds to 90 seconds. Identical results were obtained, showing that the chemical reactions of the silanol were completed within 15 seconds.

Example 3

Example 1 was repeated, except that 100 cycles were used instead of 4 cycles. A film with a uniform total thickness of 1.2 μm (1200 nm) was obtained. This result demonstrated that consistent layers of 12 nm thickness were deposited per cycle for at least 100 cycles.

Example 4

Example 1 was repeated, except that the doses of both reactants were doubled. The film thickness and its properties were unchanged from those of Example 1. These results show that the surface reactions are self-limiting.

Example 5

Figure 8:
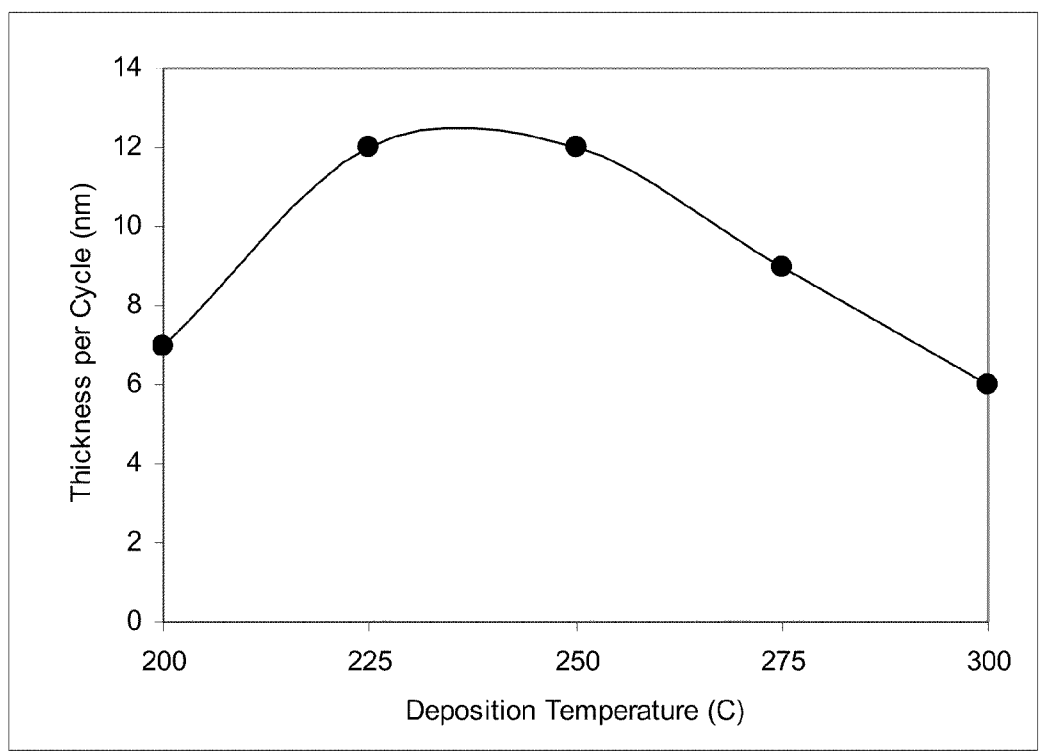
FIG. 8 is a graphical representation illustrating that the thickness of the layer deposited per cycle depends on the temperature of the substrate during deposition.

Example 1 was repeated, except that the substrate temperatures were varied within the range from 200° C. to 300° C. The resulting film thickness varied with temperature as shown in FIG. 8. These results demonstrate that the highest film deposition rate occurs for substrates held at temperatures between 225° C. to 250° C.

Example 6

Example 1 was repeated with tris(tert-pentyloxy)silanol vapor in place of the tris(tert-butoxy)silanol vapor. Similar results that those of Example 1 were obtained.

Example 7

Example 1 was repeated, except that hexakis(dimethylamido)dialuminum vapor was used in place of the trimethylaluminum vapor, and the apparatus of FIG. 1 was used in place of the apparatus of FIG. 2. Similar results that those of Example 1 were obtained.

Example 8

Example 7 was repeated with a dose of water vapor between the doses of tris(dimethylamino)aluminum vapor and tris(tert-butoxy)silanol vapor. A similar film was obtained.

Example 9

Example 3 was repeated except that every tenth dose of the tris(tert-butoxy)silanol vapor was replaced with di-isopropyl phosphate vapor. A silica/alumina/phosphate nanolaminate was obtained.

Example 10

Example 1 was repeated using substrates of fused silica, soda-lime glass, glassy carbon, stainless steel, copper, aluminum and platinum. Identical results were obtained.

Comparative Example 1

Example 1 was repeated using only the silicon and oxygen precursor, tris(tert-butoxy)silanol, and no aluminum precursor. No film was observed to have been deposited on the substrate surface.

Comparative Example 2

Example 1 was repeated using only the aluminum precursor, trimethylaluminum, and no silicon precursor. No film was deposited.

Comparative Example 3

Example 7 was repeated using only the aluminum precursor, hexakis(dimethylamido)dialuminum, and no silicon precursor. No film was deposited.

Comparative Example 4

Example 1 was repeated using the tetrakis(tert-butoxy) silane in place of the tris(tert-butoxy)silanol. No film was deposited. This example illustrates that the reactivity of the silicon precursor depends on the presence of the silanol (—OH) group.

Those skilled in the art will recognize or be able to ascertain using no more than routine experimentation, many equivalents to the specific embodiments of the invention described specifically herein. Such equivalents are intended to be encompassed within the scope of the following claims.

What is claimed is:

1. A method comprising:
    exposing a substrate having a surface to a vapor of a first reactant, wherein at least a portion of the first reactant adsorbs on the surface of a substrate to form at most an atomic monolayer of the first reactant;
    introducing a vapor of a silanol-containing reactant, wherein the first reactant adsorbed on the surface of the substrate catalytically reacts with the silanol-containing reactant to form a silica nanolaminate.

2. The method of claim 1, wherein the first reactant comprises a Lewis acid metal or metalloid.

3. The method of claim 2, wherein the Lewis acid metal or metalloid is selected from the group consisting of aluminum, boron, magnesium, scandium, lanthanum, yttrium, zirconium or hafnium.

4. The method of claim 2, wherein the Lewis acid metal or metalloid comprises aluminum.

5. The method of claim 1, wherein the substrate comprises a pore having an opening on the surface, and wherein a portion of the silica nanolaminate conforms to the surface and another portion of the silica nanolaminate forms a plug sealing the opening of the pore and leaving at least an interior portion of the pore as a void.

6. The method of claim 1, wherein the surface is a non-planar surface and comprises a feature comprising an interior space.

7. The method of claim 1, wherein the substrate includes an integrated circuit that comprises
    a plurality of active device regions; and
    trenches embedded within the substrate between the active device regions;
    wherein the silica nanolaminate fills the trenches.

8. The method of claim 7, wherein the trench has a pore and a portion of the silica nanolaminate forms a plug sealing the opening of the pore and leaving at least an interior portion of the pore as a void.

9. The method of claim 1, wherein the silica nanolaminate comprises a layer of silica having a thickness in the range of about 2-15 nm and the atomic monolayer of the first reactant having a thickness of about 0.1 nm.

10. The method of claim 1, wherein first reactant comprises aluminum and the silica nanolaminate comprises less than 1 atomic percent of aluminum.

11. A method comprising:
    exposing a substrate having a surface to a vapor of a first reactant, wherein at least a portion of the first reactant adsorbs on the surface of a substrate to form at most an atomic monolayer of the first reactant;
    introducing a vapor of a silanol-containing reactant, wherein the first reactant adsorbed on the surface of the substrate reacts with the silanol-containing reactant to form a silica layer having a thickness of at least about 2 nanometers thereby forming a silica nanolaminate.

12. The method of claim 11, wherein the first reactant comprises a Lewis acid metal or metalloid.

13. The method of claim 12, wherein the Lewis acid metal or metalloid is selected from the group consisting of aluminum, boron, magnesium, scandium, lanthanum, yttrium, zirconium or hafnium.

14. The method of claim 12, wherein the Lewis acid metal or metalloid comprises aluminum.

15. The method of claim 11, wherein the substrate comprises a pore having an opening on the surface, and wherein a portion of the silica nanolaminate conforms to the surface and another portion of the silica nanolaminate forms a plug sealing the opening of the pore and leaving at least an interior portion of the pore as a void.

16. The method of claim 11, wherein the surface is a non-planar surface and comprises a feature comprising an interior space.

17. The method of claim 11, wherein the substrate includes an integrated circuit that comprises
    a plurality of active device regions; and
    trenches embedded within the substrate between the active device regions;
    wherein the silica nanolaminate fills the trenches.

18. The method of claim 17, wherein the trench has a pore and a portion of the silica nanolaminate forms a plug sealing the opening of the pore and leaving at least an interior portion of the pore as a void.

19. The method of claim 1, wherein the silica nanolaminate comprises a layer of silica having a thickness in the range of about 2-15 nm and the atomic monolayer of the first reactant having a thickness of about 0.1 nm.

20. The method of claim 1, wherein first reactant comprises aluminum and the silica nanolaminate comprises less than 1 atomic percent of aluminum.

21. A method of forming a silica layer on a substrate, comprising:
    exposing a heated substrate comprising regions comprising a metal or metalloid compound having Lewis acid character to a silanol vapor to form a silica layer having a thickness greater than 2 nm on the acidic regions of the substrate.

22. The method of claim 21, wherein said silanol vapor is exposed in an amount sufficient to saturate the acidic regions of the substrate.

23. The method of claim 21, wherein the metal or metalloid compound is deposited as a layer on the substrate by exposing the substrate to a vapor of a metal or metalloid compound.

24. The method of claim 21, wherein the substrate includes acidic regions comprising aluminum metal or an aluminum-containing compound.

* * * * *